(12) United States Patent
Van Vaerenbergh et al.

(10) Patent No.: US 11,200,929 B1
(45) Date of Patent: Dec. 14, 2021

(54) TIME DIVISION MULTIPLEXING (TDM) BASED OPTICAL TERNARY CONTENT ADDRESSABLE MEMORY (TCAM)

(71) Applicant: HEWLETT PACKARD ENTERPRISE DEVELOPMENT LP, Houston, TX (US)

(72) Inventors: Thomas Van Vaerenbergh, Diegem (BE); Can Li, Palo Alto, CA (US); Catherine Graves, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/905,694

(22) Filed: Jun. 18, 2020

(51) Int. Cl.
G11C 7/22 (2006.01)
G11C 7/10 (2006.01)
G11C 15/04 (2006.01)
G11C 13/04 (2006.01)
G11C 11/42 (2006.01)

(52) U.S. Cl.
CPC ............ *G11C 7/222* (2013.01); *G11C 7/1012* (2013.01); *G11C 7/1054* (2013.01); *G11C 7/1081* (2013.01); *G11C 11/42* (2013.01); *G11C 13/04* (2013.01); *G11C 15/04* (2013.01)

(58) Field of Classification Search
None
See application file for complete search history.

(56) References Cited

U.S. PATENT DOCUMENTS

| | | | | |
|---|---|---|---|---|
| 4,318,581 A | * | 3/1982 | Guest | G03H 1/10 |
| | | | | 359/107 |
| 4,604,707 A | * | 8/1986 | Yamashita | G06E 1/02 |
| | | | | 340/146.2 |
| 5,247,473 A | * | 9/1993 | Houk | H03K 19/14 |
| | | | | 340/146.2 |
| 5,319,629 A | * | 6/1994 | Henshaw | G11B 7/0065 |
| | | | | 365/125 |

(Continued)

FOREIGN PATENT DOCUMENTS

CN 104422998 A 3/2015
CN 111210860 A 5/2020

(Continued)

OTHER PUBLICATIONS

Alkabani et al., "OE-CAM: A Hybrid Opto-Electronic Content Addressable Memory", Dec. 22, 2019, 14 pages.

(Continued)

*Primary Examiner* — J. H. Hur
(74) *Attorney, Agent, or Firm* — Sheppard Mullin Richter & Hampton LLP

(57) ABSTRACT

Systems and methods for an optical ternary content addressable memory (TCAM) are provided. The optical TCAM implements a time-division multiplexing (TDM) based encoding scheme to encode each bit position of a search word in the time domain. Each bit position is associated with at least two time slots. The encoded optical signal comprising the search word is routed through one or more modulators configured to represent a respective TCAM stored word. If a mismatch between at least one bit position of the (Continued)

search word and at least one TCAM stored word occurs, a photodetector or photodetector array will detect light.

7 Claims, 10 Drawing Sheets

(56) References Cited

U.S. PATENT DOCUMENTS

| | | | |
|---|---|---|---|
| 5,333,117 A * | 7/1994 | Ha | G06E 1/04 708/191 |
| 6,169,626 B1 * | 1/2001 | Chen | G02B 6/29352 359/237 |
| 7,903,445 B2 | 3/2011 | Song et al. | |
| 9,614,751 B2 | 4/2017 | Sekiya et al. | |
| 10,367,590 B2 | 7/2019 | Kielpinski et al. | |
| 11,057,143 B1 * | 7/2021 | Van Vaerenbergh | H04J 14/0236 |
| 2004/0170041 A1 | 9/2004 | Huang | |
| 2008/0193133 A1 | 8/2008 | Krug et al. | |
| 2014/0016404 A1 | 1/2014 | Kim et al. | |
| 2014/0176956 A1 * | 6/2014 | Hsieh | G02B 6/29349 356/477 |
| 2017/0317745 A1 | 11/2017 | Tezak et al. | |
| 2019/0332708 A1 | 10/2019 | Strachan et al. | |
| 2019/0356394 A1 | 11/2019 | Bunandar et al. | |
| 2020/0258587 A1 | 8/2020 | Li et al. | |

FOREIGN PATENT DOCUMENTS

| | | |
|---|---|---|
| WO | 2002/017329 A1 | 2/2002 |
| WO | WO-2019236591 | 12/2019 |

OTHER PUBLICATIONS

David A. B. Miller, "Self-Configuring Universal Linear Optical Component", Photonics Research, 2013, pp. 1-29.

Hamerly et al., "Large-Scale Optical Neural Networks Based on Photoelectric Multiplication", Phys. Rev. X 9, 021032 , May 16, 2019, p. 021032-1-021032-12.

Han et al., "A tunable optical waveguide ring resonator for microwave photonic filtering", 2013 IEEE International Topical Meeting on Microwave Photonics (MWP 2013), Oct. 2013, pp. 88-91.

Li et al., "Backcoupling manipulation in silicon ring resonators", Photonics Research, vol. 6, No. 6, Jun. 2018, pp. 620-629.

Liang et al., "A Tunable Hybrid III-V-on-Si MOS Microring Resonator with Negligible Tuning Power Consumption", Optical Society of America, 2016, 3 pages.

Pandey et al., "Tunable coupling-induced resonance splitting in selfcoupled Silicon ring cavity with robust spectral characteristics", Jun. 12, 2017, 9 pages.

Reck et al., "Experimental Realization of Any Discrete Unitary Operator", Physical Review Letters, vol. 73, No. 1, Jul. 4, 1994, pp. 58-63.

Shen et al., "Deep learning with coherent nanophotonic circuits", Nature Photonics, vol. 11, Jun. 12, 2017, pp. 441-446.

Tait et al., "Broadcast and Weight: An Integrated Network For Scalable Photonic Spike Processing", Journal of Lightwave Technology, vol. 32, No. 21, Nov. 1, 2014, pp. 3427-3439.

Mourgias-Alexandris et al., "All-optical 10Gb/s Ternary-cam Cell for Routing Look-up Table Applications", Optics Press, vol. 26, No. 6, Mar. 19, 2018, pp. 7555-7562.

Nahmias et al., "A Leaky Integrate-and-Fire Laser Neuron for Ultrafast Cognitive Computing", IEEE Journal of Selected Topics in Quantum Electronics, vol. 19, No. 5, Sep.-Oct. 2013, 12 pages.

Pitris et al., "An Optical Content Addressable Memory Cell for Address Look-up at 10 GB/s", IEEE Photonics Technology Letters, Aug. 15, 2016, 5 pages.

Tait et al., "Neuromorphic photonic networks using silicon photonic weight banks", Scientific Reports, vol. 7, Aug. 7, 2017, pp. 1-10.

Vagionas et al., "Integrated Optical Content Addressable Memories (CAM) and Optical Random Access Memories (RAM) for Ultrafast Address Look-up Operations", Applied Science, Jul. 7, 2017, pp. 1-18.

Alkabani et al.,"OE-CAM: A Hybrid Opto-Electronic Content Addressable Memory", IEEE, 2019, 14 Pages.

Pitris et al., "An Optical Content Addressable Memory Cell for Address Look-Up at 10 Gb/s", vol. 28, No. 16, 2016, IEEE, 4 pages.

Vagionas et al., "Integrated Optical Content Addressable Memories (CAM) and Optical Random Access Memories (RAM) for Ultra-Fast Address Look-Up Operations", Applied Sciences, 2017, 18 pages.

* cited by examiner

TIME DIVISION MULTIPLEXING (TDM) BASED OPTICAL TERNARY CONTENT ADDRESSABLE MEMORY (TCAM)

DESCRIPTION OF RELATED ART

Content addressable memory (CAM) is a type of memory that can perform a search operation in which a data string may be input as search content and the resulting output is an address of a location in the memory that stores matching data. This is in contrast to a read operation, in which an address is input and the resulting output is the data stored in the memory location corresponding to the searched address. Certain CAMs may be able to perform both the aforementioned search operation and the aforementioned read operation, while non-CAM memories may be able to perform the read operation but not the search operation.

Ternary CAM (TCAM) is a type of CAM in which the bit cells can store a wildcard data value in addition to two binary data values. When a bit cell that stores the wildcard value is searched, the result is a match regardless of what search criterion is used to search the bit cell. Certain TCAMs may also allow a search to be conducted on the basis of a wildcard search criterion. When a bit cell is searched based on the wildcard search criterion, the result is a match regardless of what value is stored in the bit cell.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
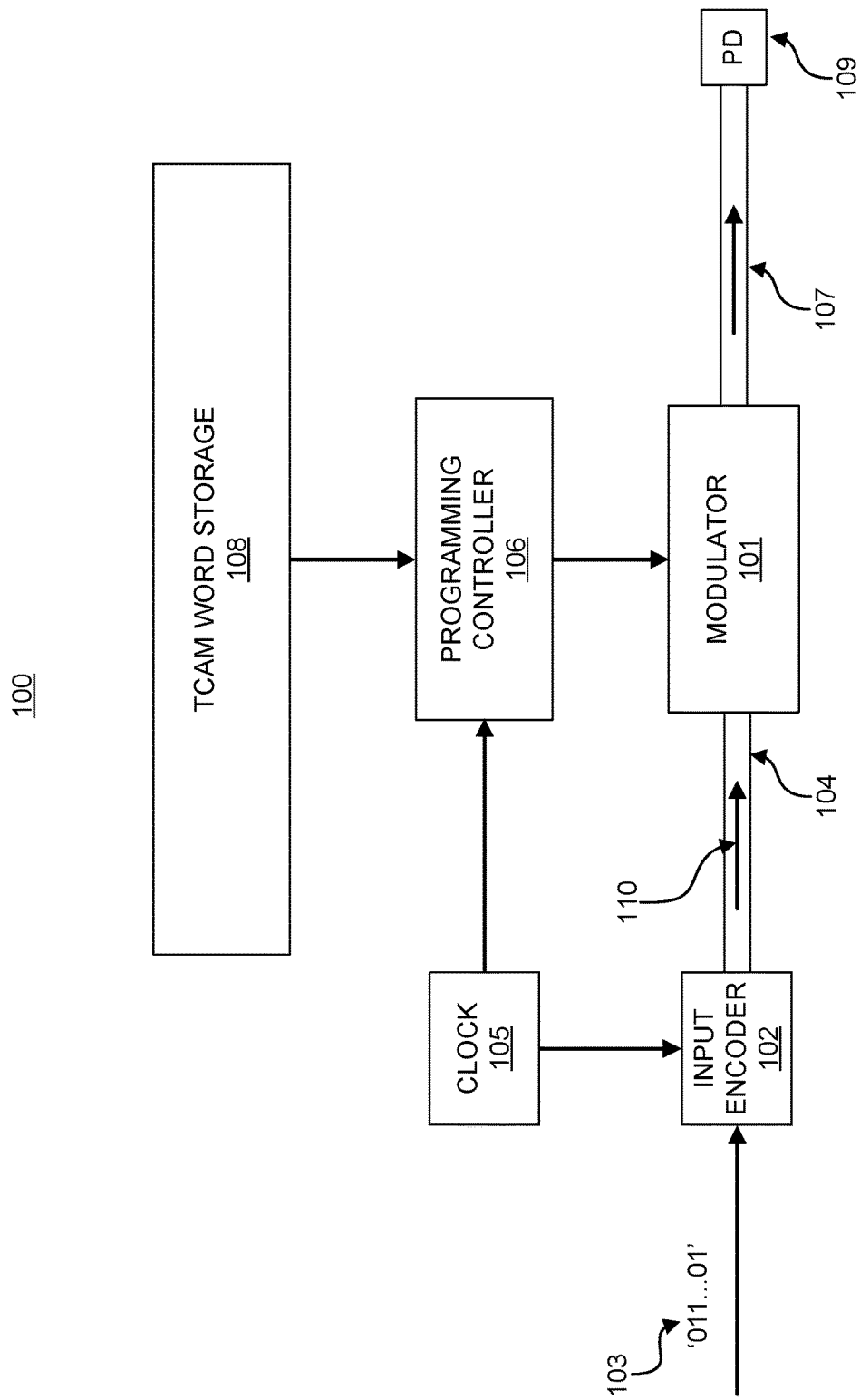
FIG. 1 illustrates an example optical search engine in accordance with embodiments of the technology disclosed herein.

The figures are not exhaustive and do not limit the present disclosure to the precise form disclosed.

DETAILED DESCRIPTION

Content addressable memory (CAM) is a special type of memory generally used in high-speed search applications. CAMs comprise hardware (circuitry) that compares an input pattern against stored binary data. The stored data of a CAM is not accessed by its location, but rather access is performed based on its content. A search word is input to the CAM, the CAM searches for the search word in its contents, and, when found, the CAM returns the address of the location where the found contents reside. CAMs are powerful, efficient, and fast. The input patterns and data in CAMs are represented by logic '0's and logic '1's (generally referred to as a binary CAM or bCAM).

Ternary CAM (TCAM) goes beyond the binary nature of bCAM, allowing for the storage and searching for a third value, referred to as a wildcard or "don't care" bit. A stored wildcard bit is treated like a match, regardless of whether the search criterion for the bit of the stored data word is a logic '0' or a logic '1.' In this way, TCAMs allow for additional complexity as the input pattern can represent a range of patterns rather than only one pattern. For example, an input pattern of "01XX0" could indicate a match for four separate stored words: 01000; 01010; 01100; and 01110. TCAMs perform the in-memory comparison operation in a massively parallel way, enabling extremely high throughput compared to older approaches. This increase in throughput enabled Internet packet routing, real-time network traffic monitoring, and more efficient access control lists, among other improvements in applications requiring fast memory comparisons.

Increasingly, data transfer is being performed using optical communication technologies. Transferring data using optics enables extremely higher bandwidth compared to traditional data transfer electronically. Although applications are frequently using integrated optics to transfer data, existing CAM implementations usually require electronic signals. Accordingly, costly optical-to-electrical conversions are required to convert the data from the optical to the electrical domain. Existing CAM and TCAM implementations will increasingly become bottlenecks due to the need for these conversions, reducing the overall efficiency and throughput possible within a network.

In a related co-pending application, U.S. patent application Ser. No. 16/905,674, filed Jun. 18, 2020, which is herein incorporated by reference in its entirety, the inventors disclosed a opto-electrical TCAM encoding scheme and hardware platform comprising an optical matrix-vector multiplication engine based on dense wavelength demultiplexing in integrated photonic circuits. The inventors also disclosed a similar encoding scheme implementing an all-optical (i.e., coherent) hardware platform where light of a single wavelength is encoded and the matrix-vector multiplication is implemented using phase control in multipath interferometers.

In the present disclosure, a method and system for an opto-electrical TCAM is disclosed utilizing time division multiplexing (TDM). Various embodiments in accordance with the technology disclosed herein encodes a search word on a wavelength in the time domain. Each bit position of the search word is associated with a set of time slots. A modulator is configured to represent a TCAM stored word, with the modulator being driven by a programming controller in accordance with a TDM encoding scheme discussed in greater detail below. An input routing element optically couples the optical search signal into the modulator. A mismatch is indicated if, during any time slot, light is allowed to pass through the modulator. In various embodiments, a common clock signal can be utilized by the input encoded and the programming controller to ensure that the bit position encoding is synchronized between the input encoder and the modulator. In various embodiments, a plurality of modulators may be connected in series or in parallel, each modulator configured to represent a different TCAM stored word, enabling the search word to be compared against a plurality of TCAM stored words serially or in parallel, respectively. In various embodiments, the TDM encoding scheme can be combined with a wavelength-division multiplexing (WDM) and/or spatial multiplexing approach to enable a plurality of search words to be searched against a plurality of TCAM stored words in parallel. In various embodiments, a TCAM optical search engine can be implemented using integrated optics (e.g., an integrated optical circuit/chip) or free-space optics.

FIG. 1 illustrates an example optical search engine 100 in accordance with embodiments of the technology disclosed herein. The example optical search engine 100 is provided for illustrative purposes only and should not be interpreted as limiting the scope of the technology to only the depicted embodiment. For ease of discussion, the optical search engine 100 of FIG. 1 is discussed with respect to comparison of a search word and one TCAM stored word through the use of an optical modulator 101, but in various embodiments the optical search engine 100 can include a plurality of modulators 101, each associated with a TCAM stored word to enable comparison of a plurality of TCAM stored words against the search word. As shown in FIG. 1, a search word 103 is received by an input encoder 102. In various embodiments, the optical search engine 100 may include one or more input encoders 102, each input encoder 102 configured to encode a search word 103 of one or more received search words 103, and in other embodiments the input encoder 102 may be configured to encode one or more search words 103. In some embodiments, an optical search engine input (not shown in FIG. 1) may be configured to receive the one or more search words 103 and transmit each received one or more search words to the input encoder 102. The one or more search words 103 may be received over an electrical connection (e.g., over an electrical trace), over an optical routing element (e.g., a waveguide, optical fiber), or a combination of both.

In various embodiments, the input encoder 102 is configured to encode the one or more received search words 103 in the time domain. In various embodiments, the bits of each of the one or more search words 103 are encoded on the same wavelength. In some embodiments, each search word 103 may be encoded on a plurality of wavelengths. Table 1 illustrates a TDM-based encoding scheme in accordance with the technology disclosed herein.

TABLE 1

| Search Word Bit Value | Encoded Search Signal Bit Value ($t_1$) | Encoded Search Signal Bit Value ($t_2$) |
|---|---|---|
| 1 | A | 0 |
| 0 | 0 | A |
| X | 0 | 0 |

As shown in Table 1, each logical bit value is represented by two time slots $t_1$, $t_2$. If the search word bit value is a logic '1', light having an amplitude A is transmitted within the first time slot $t_1$ associated with the bit position and no light is transmitted within the second time slot $t_2$. For the search word bit value of a logic '0', no light is transmitted in the first time slot $t_1$ associated with the bit position and light having an amplitude A is transmitted within the second time slot $t_2$. And, if the bit value at a bit position of the search word 103 is a wildcard bit 'X', no light is transmitted in either the first time slot $t_1$ or the second time slot $t_2$. In various embodiments, the time slots $t_1$, $t_2$ associated with a bit position may comprise consecutive time slots, while in other embodiments the associated time slots $t_1$, $t_2$ with a bit position may comprise non-consecutive time slots. Although the encoding is discussed with respect to Table 1, a person of ordinary skill in the art would understand that the assignment of light/no light in the associated time slots $t_1$, $t_2$ can be reversed in various embodiments. For example, the logical bit value '1' could have no light transmitted within the first time slot $t_1$ and transmit light having an amplitude in the second time slot $t_2$. In some embodiments, the amplitude A may be the same for each bit position, while in other embodiments at least one bit position may transmit light of a different amplitude A than at least one other bit position. In various embodiments, the amplitude A of each bit can decrease from a maximum amplitude A for the first time slot $t_1$ to a minimum amplitude A for the nth time slot $t_n$. In various embodiments, a more advanced amplitude scheme can be implemented, wherein the amplitude A for each time slot t can varying over a range of different amplitudes.

For ease of reference, the technology disclosed herein shall be described with respect to encoding of the search signal in time based on amplitude, but the encoding scheme can also be implemented based on different characteristics of light. As a non-limiting example, the input encoder 102 can be configured to encode the optical search signal using the polarization of the wavelength. For example, if the search word bit value is a logic '1', the encoding scheme could comprise light of a first polarization within the first time slot $t_1$ and light of a second polarization in the second time slot $t_2$, the reverse association fora logic '0', and omitting light of the first polarization and the second polarization in both time slots $t_1$, $t_2$ to represent a wildcard bit 'X'. In various embodiments, the wildcard value 'X' can be represented by including light of either the first polarization or the second polarization in both time slots $t_1$, $t_2$. As another non-limiting example, the phase of light of the single wavelength can be used, with three different phases being utilized (two phases in combinations to represent logic '1' and '0', and a third phase for representing a wildcard 'X'). In various embodiments, the wildcard value 'X' can be represented by including light of either the first phase or the second phase in both time slots $t_1$, $t_2$. The technology should not be interpreted as limited to encoding based on amplitude, but can also be implemented based on phase, fundamental mode profile, or other degrees of freedom of light. As a non-limiting example, different modes of light can be utilized to differentiate between logic values for the bits. A logic '1' can be represented by having light of a first mode in the first time slot $t_1$ and light of a second mode in the second time slot $t_2$, a logic '0' can be represented by light of a second mode in the first time slot $t_1$ and light of the first mode in the second time slot $t_2$, and the wildcard value can be represented by having light of a third mode in both the first time slot $t_1$ and the second time slot $t_2$. As another non-limiting example, the wildcard value can be represented by not having light in either the first mode or the second mode during both the first time slot $t_1$ and the second time slot $t_2$. In such embodiments, the one or more routing elements can be configured to propagate at least three modes of light.

In various embodiments, the encoded search signal 110 will comprise 2N time slots, where N is the number of bit positions in the search word. As a non-limiting example, the search word 103 may comprise 8 bit positions (e.g., '01101000'), and the encoded search signal 110 can comprise 8 sets of associated time slots t (i.e., 16 time slots t total). In some embodiments, each associated time slot $t_1$, $t_2$ may comprise more than one time slot t. As a non-limiting example, the first time slot $t_1$ may comprise 2 time slots $t_{1\_1}$, $t_{1\_2}$ and the second time slot $t_2$ may comprise 2 time slots $t_{2-1}$, $t_{2-2}$. Associating more than a set of time slots $t_1$, $t_2$ with a bit position can increase the amount of time for the comparison. In various embodiments, the time slots $t_1$, $t_2$ associated with a bit position may be non-continuous (i.e., the time slots may be separated by one or more time slots not associated with the bit position). A key can be included to descramble the light signals at the photodetector 109.

Although discussed with respect to encoding a search word on a single wavelength, in various embodiments a search word may be encoded on a single frequency. As is understood in the art, the frequency of a signal is inverse to its wavelength, wherein the product of the frequency and the wavelength of a signal is equal to the speed of light. Accordingly, a corresponding frequency can be determined from an wavelength by dividing the speed of light by the wavelength.

The encoded search signal 110 generated by the input encoder 102 can be coupled to an optical input routing element 104. The optical input routing element 104 may comprise an optical waveguide, an optical fiber, or other optical routing medium known in the art. The optical input routing element may be made of, but not limited to, one or more of gallium arsenide (GaAs), indium phosphide (InP), silicon (Si), silicon nitride (SiN), $LiNbO_3$, glass, and silica, among other materials. In various embodiments, the optical input routing element 104 may be disposed in a silicon photonics assembly. One or more of the elements illustrated in FIG. 1 may be disposed in a silicon photonics assembly. The optical input routing element 104 can include one or more coupling components (not shown in FIG. 1) disposed at the first end to couple the encoded search signal 110 from the input encoder 102 and at the second end to couple the encoded search signal 110 into the modulator 101. In various embodiments, a plurality of optical input routing elements 104 may be included, each optical input routing element 104 configured to couple the encoded search signal 110 from the input encoder 102 to a modulator 101 of a plurality of modulators 101.

To perform a TCAM search operation, the modulator 101 can be modulated in time to represent a TCAM stored word. In various embodiments, the modulator 101 may comprise one or more optical filters, including but not limited to waveguide resonators (e.g., ring modulator), multipath interferometers (e.g. Mach Zehnder interferometer (MZI)), photonic crystals (e.g., lithium niobate ($LiNbO_3$)), phase shifters, polarization filters, lattice filters, or other optical filter components capable of being driven by an electronic signal to tune the performance characteristics of the modulator 101. In various embodiments, the optical search engine 100 can include a plurality of modulators 101, each modulator 101 configured to compare a different TCAM stored word against the encoded search signal 110. In some embodiments, one or more modulators 101 may be configured in parallel, with a copy of the encoded search signal 110 optically coupled to an input of each of the one or more modulators 101. One or more modulators 101 may be connected in series in some embodiments, with the output of a first modulator 101 optically coupled to the input of a second modulator 101, the output of the second modulator 101 optically coupled to a third modulator 101, and so on.

In various embodiments, a programming controller 106 can be used to tune one or more modulators 101 in time to represent the bit positions of one or more TCAM stored words. In various embodiments, the programming controller 106 can be configured to control tuning of all of the modulators of the optical search engine, while in other embodiments a plurality of programming controllers 106 can be included, each of the plurality of programming controllers 106 configured to tune one or more modulators 101. Each modulator 101 may have an associated programming controller 106 in various embodiments. Each modulator 101 can be communicatively coupled to one or more tuning components (not shown in FIG. 1), each of the one or more tuning components capable of changing an optical characteristic of the modulator 101 to enable tuning of the performance of the modulator 101. In various embodiments, the one or more tuning components can comprise one or more devices configured to change the refractive index of the core or cladding of the modulator 101, control the number of free carriers, and/or create a red and/or blue shift of the resonance wavelength of the modulator 101. Non-limiting examples of tuning components include heaters, electrical contacts, among other devices used to tune the resonance wavelength of optical components. In various embodiments, the programming controller 106 can comprise a processing component, a field programmable gate array (FPGA), an application specific integrated circuit (ASIC), or other type of processor present in computing systems. In some embodiments, the processing controller 106 can comprise a central processing unit (CPU), a graphics processing unit (GPU), or other processing component external to the optical search engine 100.

Each of the TCAM stored words can be maintained in a TCAM word storage 108 in various embodiments. The TCAM word storage 108 can comprise a non-transitory machine-readable storage medium configured to store one or more TCAM words. Non-limiting examples of the TCAM word storage 108 can comprise common forms of memory including RAM, PROM, EPROM, FLASH-EPROM, NVRAM, memristors, optical storage memories, among electrical, optical, or electro-optical storage medium. In various embodiments, the TCAM word storage 108 can comprise one or more types of volatile and/or non-volatile memory. In various embodiments, the TCAM word storage 108 may be a dedicated memory component for the optical search engine 100 configured to store TCAM stored words, while in other embodiments the TCAM word storage 108 can be a partition or other assigned space in a shared memory component. The TCAM word storage 108 may be implemented in a storage area network (SAN) or other networked storage solution. The programming controller 106 can be communicatively coupled to the TCAM word storage 108 and configured to retrieve a TCAM stored word to compare against the encoded stored word through the modulator 101. In various embodiments, each of the TCAM stored words can be associated with a specific modulator 101 within the optical search engine 100 such that the programming controller 106 would always apply the drive signal representing the TCAM stored word to the same modulator 101. The programming controller 106 can maintain a mapping of TCAM stored words to the modulators 101 in a dedicated memory component of the programming controller 106 (not shown in FIG. 1), in the TCAM word storage 108, or in another separate memory component communicatively coupled to the optical search engine 100 (not shown in FIG. 1), or a combination thereof. In some embodiments, each TCAM stored word can be saved in the TCAM word storage in a memory space assigned to a specific modulator 101, with an identifier identifying the associated modulator 101, or a combination thereof. In some embodiments, each TCAM word can be stored in the TCAM word storage 108 in its encoded state, while in other embodiments the TCAM words can be stored in an unencoded state. When storing the TCAM stored word in the encoded state the latency between retrieving the TCAM stored word and applying the associated drive signal by the programming controller 106 is reduced but the memory footprint of the TCAM word storage 108 may be larger than when the TCAM stored words are stored in an unencoded state (since the size of the word is at least doubled in the encoded state to have a logic value for each time slot assigned to the bit position). The method of storage (encoded or unencoded) depends on the requirements of the application in which the TCAM is implemented.

In performing a TCAM operation on the search word 103 encoded in accordance with Table 1, the programming controller 106 can be configured to tune the modulator to either allow light of the wavelength of the encoded word or to block the light. Table 2 shows the operational state of the modulator 101 for each corresponding bit value of the TCAM stored word retrieved from the TCAM word storage 108.

TABLE 2

| TCAM Stored Word Bit Value | Modulator ($t_1$) | Modulator ($t_2$) |
|---|---|---|
| 1 | Block | Pass |
| 0 | Pass | Block |
| X | Block | Block |

As shown in Table 2, the modulator 101 can either be configured to pass light or block light within the time slots t associated with the bit position of the TCAM stored word bit value. To represent a logic '1', the modulator 101 can be tuned to block light at the encoded wavelength during the first time slot $t_1$ associated with the bit position and tuned to pass light at the encoded wavelength during the second time slot $t_2$. In various embodiments, "blocking" light can comprise removing light at a given wavelength from a waveguide using one or more stop band or drop optical filters, or through destructive interference of light at the given wavelength. To represent a logic '0', the modulator 101 can be tuned to pass light at the encoded wavelength during the first time slot $t_1$ associated with the bit position and tuned to block light at the encoded wavelength during the second time slot $t_2$. To represent a wildcard value 'X', the modulator 101 can be tuned to block light at the encoded wavelength during both time slots $t_1$, $t_2$ associated with the bit position. In various embodiments, the programming controller 106 can be configured to apply a high-speed electrical signal to the one or more tuning components capable of changing the optical characteristics of the modulator 101 such that the modulator 101 can be configured in accordance with Table 2 during the time slots $t_1$, $t_2$.

Using the encoding scheme discussed above, the optical search engine 100 can be configured to provide full optical ternary search functionality through TDM encoding. In this way, the optical-to-electrical conversions can be avoided and the TCAM search can be performed faster. Utilizing the TDM encoding makes the optical search engine 100 more compatible with current photonics capabilities by reducing the need for optical buffers, reducing the latency in the system. Encoding in the time domain further enables each TCAM stored word to be represented with a single optical modulator 101 (which may comprise one or more optical elements (e.g., rings, MZIs, photonic crystals, etc.)), reducing the footprint of the optical search engine 100 and enabling more TCAM stored words to be compared against an input search word. Based on the logic states indicated in Tables 1 and 2, light will pass through the modulator 101 during a given time slot t only when a mismatch occurs between the value of the bit position of the search word 103 and the corresponding value of the bit position of the TCAM stored word. Table 3 shows the results based on the encoded bit value on the optical search signal and of the corresponding modulator 101.

TABLE 3

| Search Word ($t_1$, $t_2$) | Modulator ($t_1$, $t_2$) | Match/Mismatch (passed/blocked) |
|---|---|---|
| 1/(A, 0) | 1/(block, pass) | Match (blocked) |
| 0/(0, A) | 0/(pass, block) | Match (blocked) |
| 1/(A, 0) | 0/(pass, block) | Mismatch (passed) |
| 0/(0, A) | 1/(block, pass) | Mismatch (passed) |
| X/(0, 0) | ANY | Match (blocked) |
| ANY | X/(block, block) | Match (blocked) |

As shown in Table 3, when the bit of the encoded word is a logical '1', the input (encoded optical search signal from the input encoder 102) includes light of a single wavelength having an amplitude A during the first time slot $t_1$ of the associated bit position and does not include light of the single wavelength during the second time slot $t_2$ (i.e., no light is on the input routing element 104). If the bit value of the TCAM stored word at the corresponding bit position is also a logic '1', the modulator 101 would be driven such that the modulator 101 is tuned to block light of the single wavelength during the first time slot $t_1$ and pass light of the single wavelength during the second time slot $t_2$. Therefore, because during the first time slot $t_1$ the modulator 101 is configured to block light of the single wavelength, the light on the input routing element 104 is not permitted to pass through the modulator 101 and into an output routing element 107. And, because there is no light on the input routing element 104 during the second time slot $t_2$, no light would pass through the modulator 101 to the output routing element 107 even though it is configured to pass light because no light is on the input routing element 104 during the second time slot $t_2$. Accordingly, the lack of light on the output routing element 107 indicates that the bit values of the search word 103 and the TCAM stored word at the respective bit position matched.

When the bit of the encoded word is a logical '0', the input (encoded optical search signal from the input encoder 102) does not include light of a single wavelength during the first time slot $t_1$ of the associated bit position and does include light of the single wavelength having an amplitude A during the second time slot $t_2$. If the bit value of the TCAM stored word at the corresponding bit position is also a logic '0', the modulator 101 would be driven such that the modulator 101 is tuned to pass light of the single wavelength during the first time slot $t_1$ and block light of the single wavelength during the second time slot $t_2$. Therefore, because the modulator 101 is configured to pass light of the single wavelength during the first time slot $t_1$, no light would pass through the modulator 101 and into the output routing element 107 (because no light of the single wavelength is included in the signal during the first time slot $t_1$). And, because during the second time slot $t_2$ the modulator 101 is configured to block light of the single wavelength, the light on the input routing element 104 is not permitted to pass through the modulator 101 and into an output routing element 107. Accordingly, the lack of light on the output routing element 107 indicates that the bit values of the search word 103 and the TCAM stored word at the respective bit position matched.

In addition, if the bit value of the bit position of the TCAM stored word is a wildcard value 'X', regardless of whether the input is a logic '1' or '0', no light is present on the output waveguide 107. To represent the wildcard value 'X' (or the "don't care" bit as it is also called), the modulator is driven by the programming controller 106 to block light of the single wavelength on which the search word 103 is encoded during both time slots $t_1$, $t_2$. Therefore, a match is always indicated for that bit position, regardless of the value at the corresponding bit position of the search word 103. Similarly, if the search word 103 included a wildcard value 'X' at a bit position, a match would always be indicated regardless of the associated bit value at the bit position in the TCAM stored word because no light would be on the input routing element 104, and therefore no light would pass the modulator 101 onto the output routing element 107.

A mismatch at a given bit position is indicated by the presence of light on the output routing element 107. As seen in Table 3, when the bit position of the input is a logic '1' but the bit position of the TCAM stored word is a logic '0' light is passed to the output routing element 107 during the first time slot $t_1$. The modulator 101 is configured to pass light of the single wavelength and the input includes light having an amplitude A of the single wavelength on the input routing element 104 during the first time slot $t_1$. Therefore, the light would pass through the modulator 101 to the output routing element 107. Where the bit values are reversed, light would be on the output routing element 107 during the second time slot $t_2$, indicating the mismatch between the search word 103 and the TCAM search word at the respective bit position.

In various embodiments, the encoding of the search input 103 can be performed in accordance with a clock (CLK) signal from clock 105. The CLK signal can be used to identify each of the time slots $t_1$, $t_2$ associated with each respective bit position of the search word 103. In various embodiments, the CLK signal from clock 105 can also be used by the programming controller 106 to generate the drive signal used to configured the modulator 101 to represent the TCAM stored word. In some embodiments, the programming controller 106 can include one or more circuits to delay the CLK signal from clock 105 such that the programming controller 106 applies the drive signal in sync with the encoded search signal 110 as it is optically coupled into the modulator 101. In some embodiments, a second CLK signal (different from the CLK signal used by the input encoder 102) can be sent to the programming controller 106 from the same clock 105 or a different clock source.

As seen in FIG. 1, a photodetector 109 can be optically coupled to a result end of the output routing element 107 in various embodiments. The photodetector 109 can be configured to sense whether any light is present on the output routing element 107, thereby detecting the mismatch for the respective bit position. In various embodiments, the photodetector 109 can comprise a photodiode or other type of circuit-type detector of photons. In various embodiments, each photodetector 109 can include circuitry configured to output a memory address corresponding to the stored word represented by the modulator 101. In some embodiments, each photodetector 109 can output a match/mismatch indication to an encoder circuit (not shown in FIG. 1) configured to generate the memory address corresponding to the stored word of the modulator 101 for which a match indication is received from a photodetector 109. In some embodiments, each photodetector 109 may send the indication to a processing circuit within the optical search engine 100 (not shown in FIG. 1) being configured to identify the memory address associated with the specific TCAM stored word represented by the modulator 101 and output an electrical signal to a memory controller or other device controller access to the memory storage.

In various embodiments, the photodetector 109 can be configured to integrate the mismatches over time for the duration of the search word 103 (i.e., for the duration of the 2N time slots t), enabling the photodetector 109 to determine the sum of all mismatches between the search word 103 and the TCAM stored word represented by the modulator 101. In this way, the degree of mismatch between the search word 103 and the respective TCAM stored word. In various embodiments, the photodetector 109 can include circuitry configured to perform the integration of light for the duration of the search, while in some embodiments the photodetector 109 can be configured with a long TC time-constant to enable integration to occur within the photodetector 109. In some embodiments, the photodetector 109 can be configured to flag or otherwise identify at which bit positions a mismatch occurred.

Figure 2:
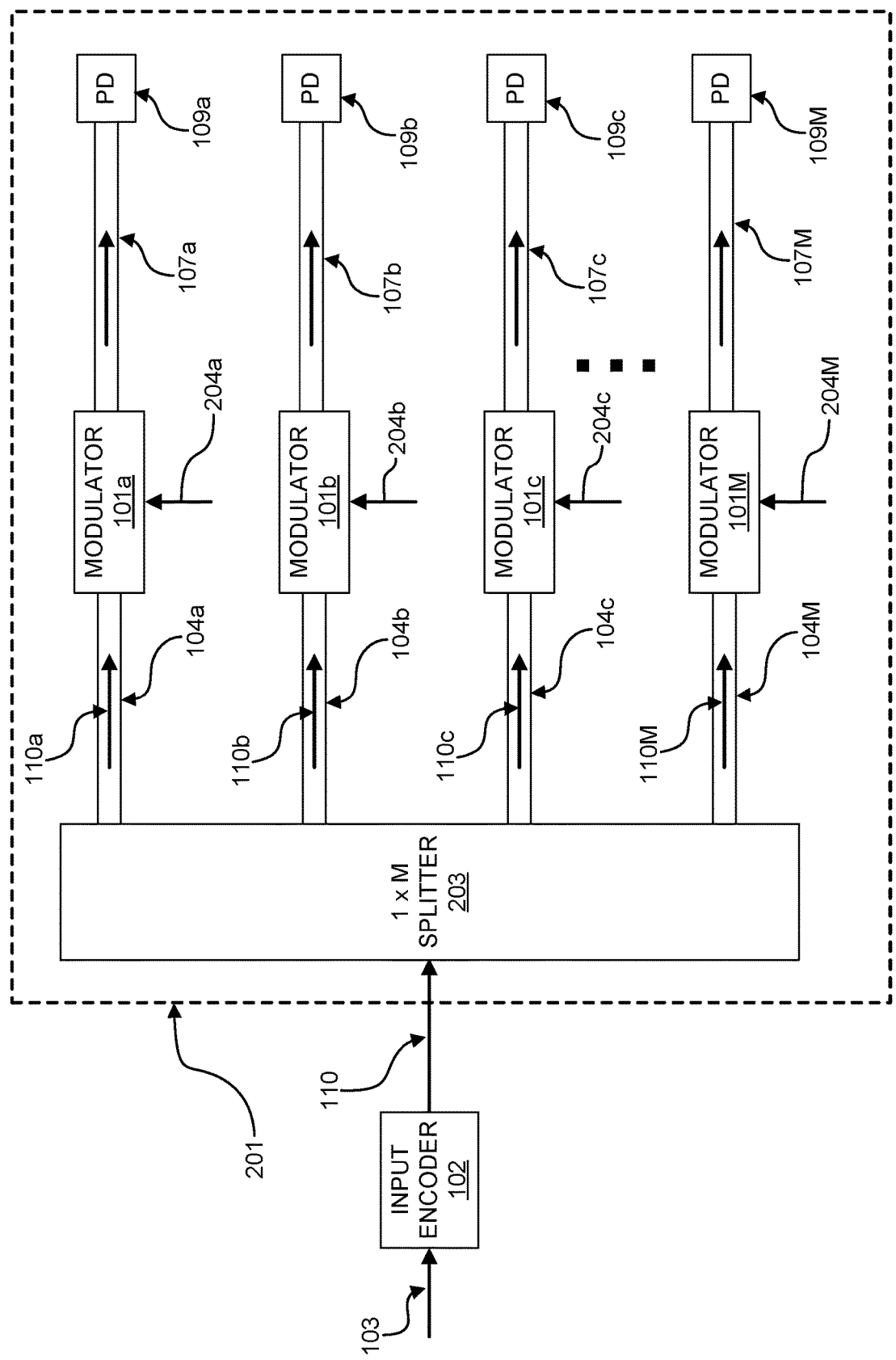
FIG. 2 illustrates another optical search engine in accordance with embodiments of the technology disclosed herein.

Although a single modulator 101 is illustrated in FIG. 1, in various embodiments the optical search engine 100 can comprise a plurality of modulators 101, each modulator 101 configured to represent a different TCAM stored word. In this way, a plurality of stored words can be compared against the search word 103 during the same search operation. FIG. 2 illustrates an example optical search engine 200 in accordance with embodiments of the technology disclosed herein. The example optical search engine 200 is provided for illustrative purposes only and should not be interpreted as limited to only the depicted embodiment. Where references are common between figures it should be interpreted that the discussion as to those references are applicable unless expressly stated otherwise.

As shown in FIG. 2, the optical search engine 200 comprises a TCAM word bank 201 configured to enable a single search word 103 to be compared against M TCAM stored words. Each TCAM search word is represented by a modulator 101a-M (generally, "the modulator 101," collectively, "the modulators 101"). In various embodiments, each modulator 101 may have a dedicated programming controller 106 (as depicted in FIG. 2), while in other embodiments one or more modulators 101 may be driven by a single programming controller 106 (not shown in FIG. 2). In various embodiments, an electrical drive signal 204a-204M (generally, "the electrical drive signal 204," collectively, "the electrical drive signals 204") is applied to a respective modulator 101 to set the modulator 101 state within each time slot t. The electrical drive signal 204 is similar to the drive signal from the programming controller 106 discussed with respect to FIG. 1. In various embodiments, the electrical drive signals 204 can be applied to each modulator 101 (and/or one or more tuning components associated with each modulator 101) from the same programming controller 106, wherein the programming controller 106 is configured generate a separate electrical drive signal for each of a plurality of TCAM stored words from the TCAM word storage (not shown in FIG. 2) such that each modulator 101 is driven to represent a different TCAM stored word. In other embodiments, one or more of the electrical drive signals 204 can be generated by a first programming controller 106 and one or more of the electrical drive signals 204 can be generated by a second programming controller 106. In some embodiments, each modulator 101 of FIG. 2 can have a dedicated programming controller 106 configured to generate and apply the electrical drive signal 204 for the respective TCAM stored word.

Although not illustrated in FIG. 2, the optical search engine 200 would include the TCAM word storage 108 and the clock 105 discussed with respect to FIG. 1. The TCAM word storage 108 and the clock 105 are omitted from FIG. 2 for ease of understanding the illustrated example of FIG. 2, and a person of ordinary skill in the art would understand that the omitted components would be present in the optical search engine 200 implementation. As shown in FIG. 2, the encoded search word 110 is output from the input encoder 102 and is optically coupled to a 1×M splitter 203. In various embodiments, the 1×M splitter 203 is configured to generate M encoded search signals 110a-M (generally, "the encoded search signal 110," collectively, "the encoded search signals 110"). In this way, the search word 103 can be compared against the M TCAM stored words of the TCAM word bank 201 in parallel. In various embodiments, the input encoder 102 and the 1×M splitter 203 can be integrated into the same component, while in some embodiments the input encoder 102 can be configured to generate M versions of the encoded search signal 110 without the need to split a generated signal.

The 1×M splitter 203 can be configured to optically couple each of the encoded search signals 110 to a respective modulator 101 of the TCAM word bank 201. In various embodiments, each output of the 1×M splitter 203 can be optically coupled to a respective modulator 101 using an associated input routing element 104a-M (generally, "the input routing element 104," collectively, "the input routing elements 104"). The input routing element 104 can include, but not limited to, one or more of a waveguide, an optical fiber, a coupler component, or other optical elements capable of guiding light from one point to another. In some embodiments, the CLK signal from clock 105 can be used by the 1×M splitter 203 to control the output of the M copies of the encoded search signal 110. The 1×M splitter 203 can include one or more clock delays configured to delay the CLK signal from clock 105 such that the outputted encoded search signal 110 is in sync with the respective modulator 101 so that the time slots t associated with a bit position of the search word 103 are synchronized with the time slots t associated with the corresponding bit position of the TCAM stored word represented by the respective modulator 101. In some embodiments, the 1×M splitter 203 can have a dedicated CLK signal from a different clock source.

Each modulator 101 can be optically coupled to a dedicated photodetector 109a-109M (generally, "the photodetector 109," collectively, "the photodetectors 109) over a respective output routing element 107a-107M (generally, "the output routing element 107," collectively, "the output routing elements 107"). Each of the photodetectors 109 shown in FIG. 2 can be similar to the photodetector 109 discussed with respect to FIG. 1. Dedicating a photodetector 109 for each modulator 101 in FIG. 2 enables the results of the comparison of the search word against each TCAM stored word to be dedicated in parallel.

Figure 3:
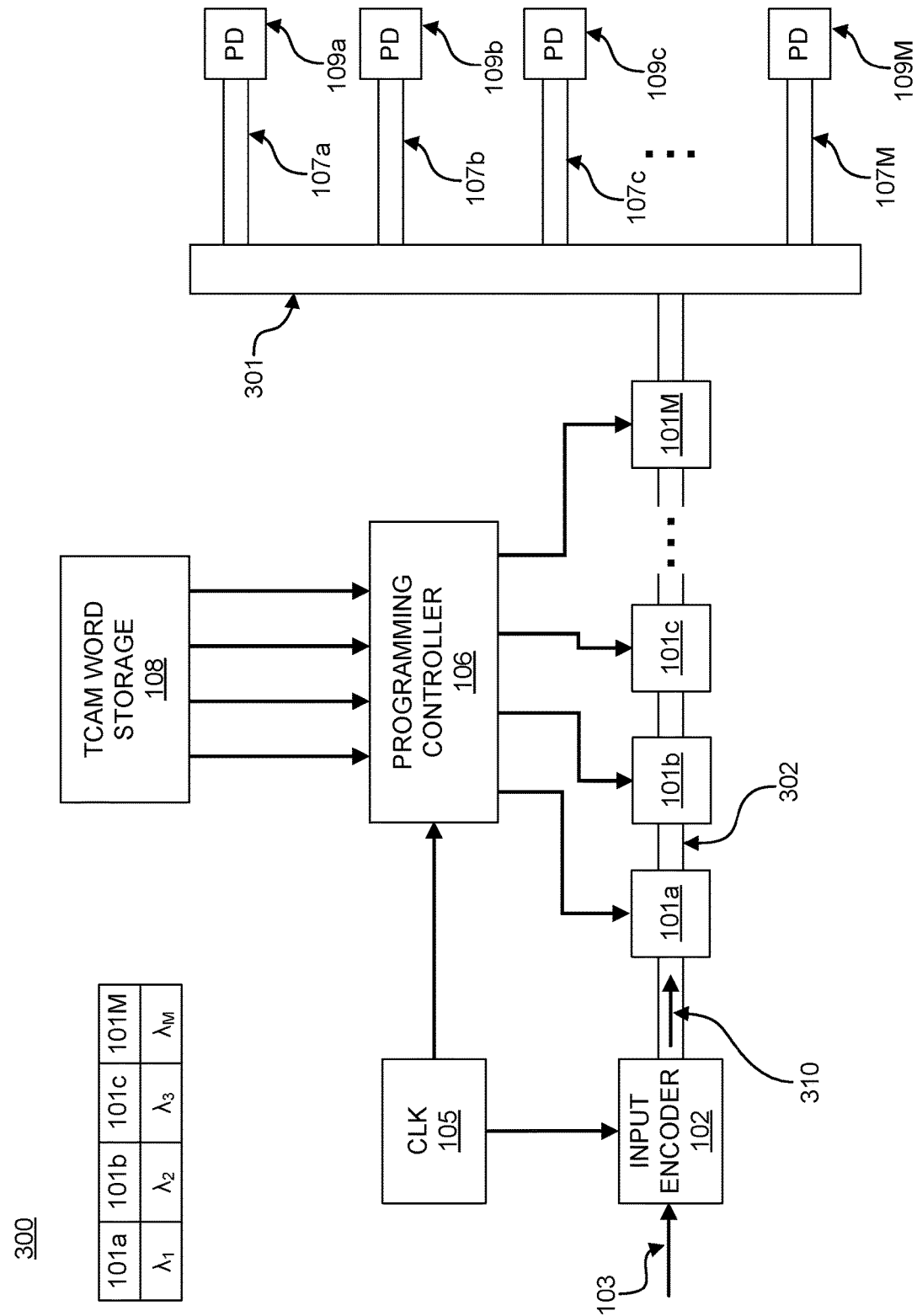
FIG. 3 illustrates another example optical search engine in accordance with embodiments of the technology disclosed herein.

FIG. 3 illustrates another example optical search engine 300 in accordance with embodiments of the technology of the present disclosure. The example optical search engine 300 is provided for illustrative purposes and should not be interpreted as limited to only the depicted embodiment. Where references are common between figures it should be interpreted that the discussion as to those references are applicable unless expressly stated otherwise. The optical search engine 300 of FIG. 3 is configured to enable a search word 103 to be compared against a plurality of TCAM stored words in series rather than in parallel. As shown in FIG. 3, each modulator 101 can be associated with a respective wavelength λ (i.e., each TCAM stored word can be associated with a respective wavelength λ). The input encoder 102 can be configured to encode the search word 103 on each of the stored word wavelengths $\lambda_1$-$\lambda_M$ (generally, "the stored word wavelength λ," collectively, "the stored word wavelengths λ"), generated a multi-wavelength encoded search signal 310. In various embodiments, the input encoder 102 can be configured to output the multi-wavelength encoded search signal 310 onto a search routing element 302. The search routing element 302 can comprise an optical element similar to those of the input routing element 104 and output routing element 107 discussed with respect to FIG. 1 in various embodiments.

Unlike the parallel configuration of FIG. 2, each of the modulators 101 can be disposed in series on the search routing element 302. As shown, the search routing element 302 can optically couple the multi-wavelength encoded search signal 310 into the first modulator 101a. As shown in FIG. 3, the first modulator 101a is associated with the stored word wavelength $\lambda_1$. Accordingly, the modulator 101a can be configured to pass light of any other wavelength λ during all time slots t, but can operate on light of the first stored word wavelength $\lambda_1$. In various embodiments, the modulator 101a can be configured to either enable light of the first stored word wavelength $\lambda_1$ to pass with all other wavelengths within the multi-wavelength encoded search signal 310 or configured to block (e.g., remove, destructively interfere) light of the first stored word wavelength $\lambda_1$. The search routing element 302 can optically couple to output of the first modulator 101a into the second modulator 101b, and the second modulator 101b can be configured to operate on light of the second stored word wavelength $\lambda_2$. As shown in FIG. 3, the search routing element 302 can continue to optically couple the output of a previous modulator 101 into a subsequent modulator 101.

With multiple wavelengths included within the multi-wavelength encoded search signal 310, having a single photodetector disposed on the end of the search routing element 302 would result in difficulty in determining with which of the TCAM stored words the search signal had at least one bit mismatch. In some embodiments, the search routing element 302 can be configured to optically couple the output of the Mth modulator 101M to an optical demultiplexer 301 configured to separate the multi-wavelength encoded search signal 310 into one or more individual wavelengths λ remaining in the multi-wavelength encoded search signal 310 after traversing all of the modulators 101. At each modulator 101, if the search word matches the associated TCAM stored word, than no light of the associated stored word wavelength λ would remain on the search routing element 302 (i.e., would be filtered out of the multi-wavelength encoded search signal 310) at the output end of the search routing element 302. Any light that remains on the search routing element 302 and enters the optical demultiplexer 301 indicates that the search word 103 had at least one bit mismatch with the associated TCAM stored word of the remaining stored word wavelength λ. In some embodiments, each modulator 101 can be configured to operate as a band pass filter. The "block" state of the modulator can be similar to an "ON" state of the modulator 101 (i.e., the modulator 101 is configured to attenuate the respective stored word wavelength λ) and the "pass" state of the modulator can be similar to an "OFF" state of the modulator 101 (i.e., the modulator 101 is configured to pass all wavelengths of light).

The optical demultiplexer 301 can be configured to output each of the separate stored word wavelengths λ onto a respective output routing element 107 associated with the respective stored word wavelength λ. The output routing elements 107 can be similar to the output routing elements 107 discussed with respect to FIGS. 1 and 2 in various embodiments. If no light is output on the output routing element 107 associated with a respective stored word wavelength λ, this indicates that the TCAM stored word associated with that respective stored word wavelength λ matched the search word 103. In various embodiments, a photodetector 109 (similar to the photodetectors 109 discussed with respect to FIGS. 1 and 2) is optically coupled to an output end of each respective output routing element 107 to detect light of the associated stored word wavelength λ. As a non-limiting example, if the search word 103 and the TCAM stored word represented by the third modulator 101c had at least one mismatched bit, the third photodetector 109c can detect light of the third stored word wavelength $\lambda_3$ and indicate that a mismatch occurred. In various embodiments, the third photodetector 109c may be configured to detect the degree of mismatch between the search word and the third TCAM stored word represented by modulator 101c.

Figure 4:
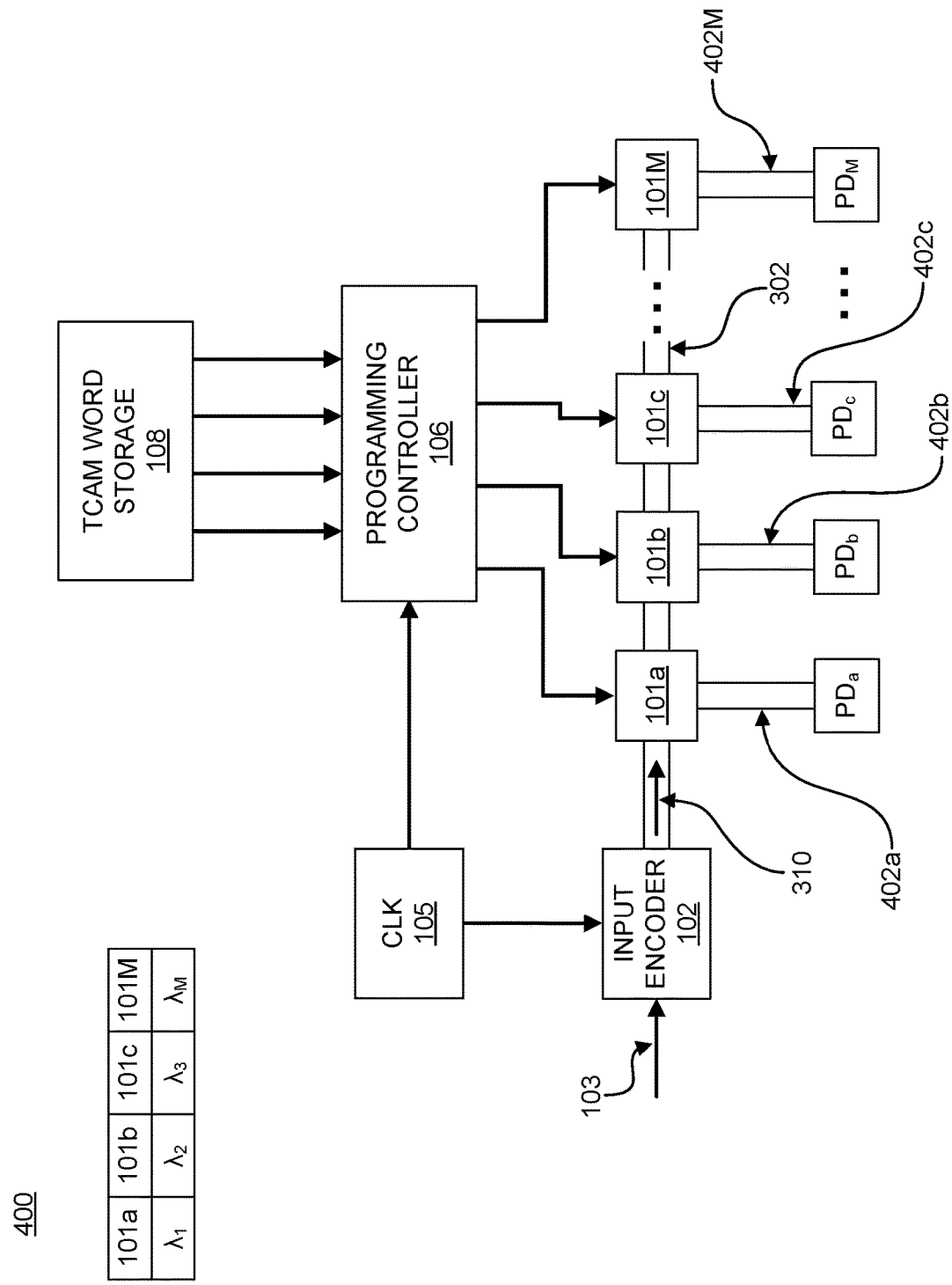
FIG. 4 illustrates another example optical search engine in accordance with embodiments of the technology disclosed herein.

The optical search engine 300 delays the detection of a match or mismatch for each bit position until the multi-wavelength encoded search signal 310 has traversed the entire length of the search routing element 302 (i.e., has passed through all of the modulators 101). FIG. 4 illustrates another example optical search engine 400 in accordance with the technology disclosed herein. The optical search engine 400 is presented for illustrative purposes only and should not be interpreted as limiting the scope of the technology to only the depicted embodiment. Where references are common between figures it should be interpreted that the discussion as to those references are applicable unless expressly stated otherwise. Unlike the optical search engine 300 discussed with respect to FIG. 3, the optical search engine 400 of FIG. 4 optically couples the associated photodetector 109 for each TCAM search word to the respective modulator 101. As shown in FIG. 4, an output routing element 402a-402M (generally, "the output routing element 402," collectively, "the output routing elements 402") can be optically coupled to each respective modulator 101. Rather than waiting until the multi-wavelength encoded search signal 310 to traverse all of the modulators, a mismatch can be detected in sequence with the comparison at the modulator 101. As a non-limiting example, the photodetector 109a can be optically coupled to the first modulator 101a by the first output routing element 402a. If a mismatch occurs, the light of the first stored word wavelength $\lambda_1$ can be output by the modulator on the first output routing element 402a and detected by the photodetector 109a before the multi-wavelength encoded search signal 310 traverses all of the other modulators 101. Using optical search engine 400 the mismatch detection can occur without the need for an optical demultiplexer at the end of the search routing element 302.

Figure 5:
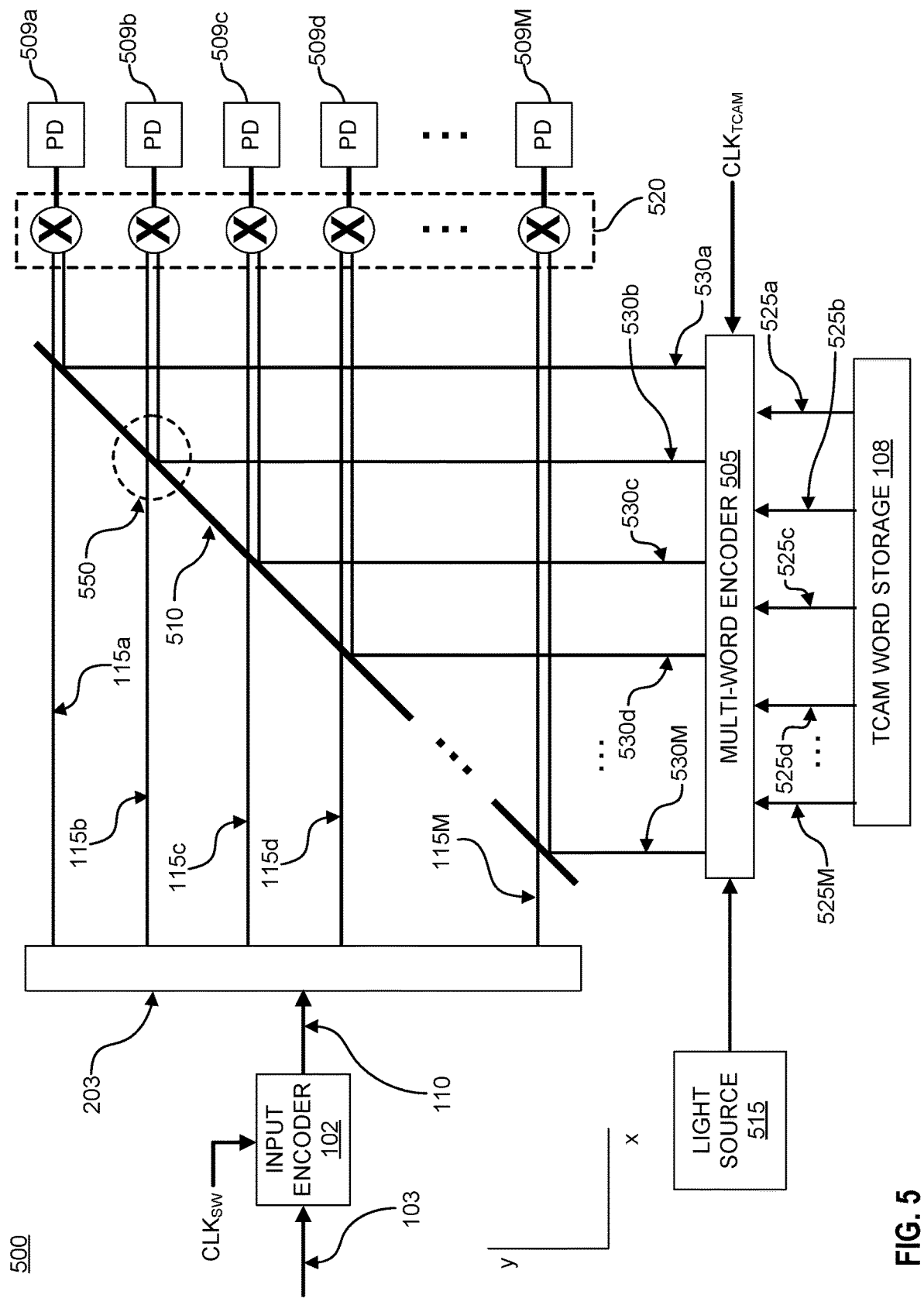
FIG. 5 illustrates an example coherent detection search engine in accordance with embodiments of the technology disclosed herein.

In various embodiments, the optical search engine of the TDM-based optical TCAM can be implemented utilizing coherent detection (i.e., homodyne detection). FIG. 5 illustrates an example coherent detection search engine 500 in accordance with embodiments of the technology disclosed herein. The example coherent detection search engine 500 is provided for illustrative purposes only and should not be interpreted as limiting the scope of the technology to only the depicted embodiment. Where references are common between figures it should be interpreted that the discussion as to those references are applicable unless expressly stated otherwise. As shown in FIG. 5, the search word 103 can be encoded by the input encoder 102 to generate a single wavelength encoded search signal 110, similar to the encoding discussed with respect to FIGS. 1 and 2. In various embodiments, a 1×M splitter 203 can be included to generated M copies 115a-115M of the encoded search signal 110 (generally, "the encoded search signal 115," collectively, "the encoded search signals 115"). Although not illustrated in FIG. 5, a clock (similar to the clock 105 discussed with respect to FIG. 1) can provide a CLK signal to the input encoder 102, which can use the CLK signal to apply the encoding scheme discussed above with respect to Table 1.

In various embodiments, each TCAM stored word to be compared against the search word 103 is encoded using the same wavelength as the one on which the search word 103 is encoded. As shown in FIG. 5, a plurality of TCAM stored words 525 can be obtained from the TCAM word storage 108 and provided to a multi-word encoder 505. In various embodiments, the multi-word encoder 505 can comprise one or more types of processors or processing circuitry, similar to the programming controller 106 discussed above with respect to FIG. 1. The multi-word encoder 505 can be configured to encode each of the TCAM stored words onto an optical signal of the same wavelength as the encoded search words 115. In various embodiments, a light source 515 can be optically coupled to the multi-word encoder 505 and configured to provide light of the single wavelength associated with the search word 103 (i.e., the single wavelength comprising the encoded search signals 115) to the multi-word encoder 505. In various embodiments, the light source 515 can comprise one or more types of light emitting diodes (LEDs; potentially with subsequent narrow-band filters) se, single-wavelength lasers, vertical cavity surface emitting lasers (VCSELs), or other light emission sources. In various embodiments, the light source 515 can be communicatively coupled to the input encoder 102 so that the input encoder 102 can encode the search word 103 on an optical signal of the single wavelength of the light source 515. In some embodiments, the input encoder 102 can be communicatively coupled to a separate light source similar to the light source 515. Where the search word is received in the optical domain, an injection-locking light source can be used by the input encoder 102 to encode the received optical search word 103 on a signal of the single wavelength of the coherent detection search engine 500.

In various embodiments, the input encoder 102 and the multi-word encoder 505 can each utilize a clock signal CLK to perform the encoding, similar to the signal from the clock 105 discussed with respect to FIG. 1 above. As shown in FIG. 5, the input encoder 102 can receive a search word clock signal CLKsw, and the multi-word encoder 505 can receive a TCAM stored word clock signal CLKTCAM. In various embodiments, the search word clock signal CLKsw and the TCAM stored word clock signal CLKTCAM can be the same clock signal, while in other embodiments the search word clock signal CLKsw and the TCAM stored word clock signal CLKTCAM can comprise different clock signals. In various embodiments, the search word clock signal CLKsw and the TCAM stored word clock signal CLKTCAM can be generated by the same clock (such as, for example, CLK 105 of FIG. 1), while in other embodiments the search word clock signal CLKsw can be generated by a first clock source and the TCAM stored word clock signal CLKTCAM can be generated by a second clock source.

The multi-word encoder 505 can comprise a plurality of optical modulators (not shown in FIG. 5), one or more of the optical modulators configured to generate an encoded TCAM word signal 530a-530M (generally, "the encoded TCAM word signal 530," collectively, "the encoded TCAM word signals 530") for each of the TCAM stored words 525 retrieved from the TCAM word storage 108. Each TCAM word signal 530 can be encoded in a similar manner to that of the encoded search signal 115. That is, unlike the embodiments discussed with respect to FIGS. 1-4, each TCAM stored word 525 is encoded as a propagating optical signal rather than encoded as a state of a modulator. Table 4 illustrates the TDM-based encoding scheme in accordance with technology disclosed herein.

TABLE 4

| TCAM Stored Word Bit Value | TCAM Word Signal ($t_1$) | TCAM Word Signal ($t_2$) |
|---|---|---|
| 1 | 0 | A |
| 0 | A | 0 |
| X | 0 | 0 |

As shown in Table 4, each logical bit value is represented by two time slots $t_1$, $t_2$, similar to the encoded search signals 115. If the TCAM stored word bit value is a logic '0', light having an amplitude A is transmitted within the first time slot $t_1$ associated with the bit position and no light is transmitted within the second time slot $t_2$. For the TCAM stored word bit value of a logic '1', no light is transmitted in the first time slot $t_1$ associated with the bit position and light having an amplitude A is transmitted within the second time slot $t_2$. And, if the bit value at a bit position of the TCAM stored word is a wildcard bit 'X', no light is transmitted in either the first time slot $t_1$ or the second time slot $t_2$. In various embodiments, the time slots $t_1$, $t_2$ associated with a bit position may comprise consecutive time slots, while in other embodiments the associated time slots $t_1$, $t_2$ with a bit position may comprise non-consecutive time slots. Although the encoding is discussed with respect to Table 1, a person of ordinary skill in the art would understand that the assignment of light/no light in the associated time slots $t_1$, $t_2$ can be reversed in various embodiments. For example, the logical bit value '0' could have no light transmitted within the first time slot $t_1$ and transmit light having an amplitude in the second time slot $t_2$. In some embodiments, the amplitude A may be the same for each bit position, while in other embodiments at least one bit position may transmit light of a different amplitude A than at least one other bit position. The encoding of each TCAM stored word 525 can be performed in a similar manner as the search word 103 discussed above with respect to Table 1.

Using the encoding scheme of Tables 1 and 4, the coherent detection search engine 500 can be configured to implement the ternary search functionality in accordance with the technology disclosed herein. Table 5 shows the results of the coherent detection of an encoded search signal 115 and a TCAM word signal 530.

TABLE 5

| Search Word ($t_1$, $t_2$) | TCAM Stored Word ($t_1$, $t_2$) | Match/Mismatch (passed/blocked) |
|---|---|---|
| 1/(A, 0) | 1/(0, A) | Match (blocked) |
| 0/(0, A) | 0/(A, 0) | Match (blocked) |

TABLE 5-continued

| Search Word ($t_1$, $t_2$) | TCAM Stored Word ($t_1$, $t_2$) | Match/Mismatch (passed/blocked) |
|---|---|---|
| 1/(A, 0) | 0/(A, 0) | Mismatch (passed) |
| 0/(0, A) | 1/(0, A) | Mismatch (passed) |
| X/(0, 0) | ANY | Match (blocked) |
| ANY | X/(0, 0) | Match (blocked) |

As shown in Table 5, when the search word 103 value at a bit position is a logic '1', the encoded search signal 115 would include light having an amplitude A of the single wavelength in the first time slot $t_1$ associated with the bit position, and no light of the single wavelength would be output during the second time slot $t_2$ (i.e., the amplitude A is zero). If the corresponding bit position of the TCAM stored word 525 is also a logic '1', the respective TCAM word signal 530 would not include light having an amplitude during the first time slot $t_1$, and a light having an amplitude A would be included in the second time slot $t_2$. As will be discussed in greater detail below, the alternating inclusion of light having an amplitude A in the associated time slots t cancel each other out, resulting in no light being detected by an associated balanced photodetector array 509 (which can include one or more photodetectors the same or similar to the photodetectors 109 discussed above with respect to FIGS. 1-4 in various embodiments). A mismatch is indicated when the encoded search signal 110 and the TCAM word signal 530 each include light having an amplitude A during the same time slot t, as discussed in greater detail below with respect to the multiplier region 520. In this manner, the comparison can be accomplished in the free-space without the need for optical transmission mediums (e.g., waveguides, optical fiber, etc.).

As shown in FIG. 5, each encoded search signal 115 propagates from the 1×M splitter 203, towards an optical interleaver 510 along the x-axis. The optical interleaver 510 is configured to route the inputted signals (i.e., the encoded search signals 115 and the TCAM word signals 530) towards a respective multiplier of the multiplier region 520. The optical interleaver 510 is configured to route each encoded search signal 115 to a first input of a respective multiplier and route each TCAM word signal 530 to a second input of a respective multiplier. As shown in FIG. 5, each multiplier in the multiplier region 520 is associated with a respective encoded search signal 115 and a respective TCAM word signal 530. In some embodiments, the optical interleaver 510 can be implemented using an optical polarizing beam splitter. In various embodiments, the optical interleaver 510 can comprise a polarizer configured to allow the respective encoded search signal 115 to pass through at a first polarization and reflect the respective TCAM word signal 530 at a second polarization. In other embodiments, the optical interleaver 510 can be implemented such that the respective encoded search signal 115 and the respective TCAM word signal 530 are spatially offset on the surface of the optical interleaver 510. In this manner, the multipliers of the multiplier region 520 can be configured to identify the source signal (i.e., either the encoded search signal 115 or the TCAM word signal 530) based on the position of the signal. In various embodiments, each encoded search signal 115 can propagate through an optical routing element, similar to the input routing element 104 discussed with respect to FIG. 1, while in other embodiments each encoded search signal 115 can propagate in free space (e.g., air, vacuum). Free-space optics is an optical communication technology that uses light propagating in free space (e.g., air, oxide, a vacuum, a bulk optical transmission medium (e.g., a slab waveguide)) rather than an optical medium (e.g., an optical fiber).

Also, each of the TCAM word signals 530, each representing a plurality of TCAM stored words 525, propagates from the multi-word encoder 505 into the towards the optical interleaver 510 along the y-axis in a similar manner as the encoded search signals 115. The interleaver 510 can comprise a polarized beam splitter or other optical element designed to produce a resultant signal including both signals at different polarizations, different positions, different modes, or a combination thereof. In various embodiments, the interleaver 510 can comprise a mirror-based pinhole array, where a plurality of pinholes are included within a mirror to allow some light to pass through the pinhole while blocking light intersecting the mirror at non-pinhole locations. In various embodiments, the interleaver 510 can route the coherent light signals passively, while in other embodiments an active optical interleaver 510 can be used. The TCAM word signals 530 propagate in a perpendicular direction to the encoded search signals 115 in various embodiments. The interleaver 510 can comprise a partially reflective element configured to allow the encoded search signals 115 to pass through the interleaver 510, while the TCAM word signals 530 can be reflected 90° such that the encoded search signals 115 and the TCAM word signals 530 propagate parallel to each other and in the same direction. In this manner, one of the encoded search signals 115 and a respective TCAM word signal 530 are arranged at the junction of the interleaver 510 in relation to each other such that each pair of input signals (i.e., each encoded search word 115/TCAM word signal 530 pair) are optically coupled to the inputs of the respective multiplier. As a non-limiting example, at the junction 550 the encoded search signal 115b is allowed to pass through the interleaver 510 while the TCAM word signal 530b is reflected 90° at the junction 550. As stated above, within each pair of input signals, the encoded search word 115 can be routed to optically couple to the first input of the multiplier and the TCAM word signal 530 can be routed to optically couple to the second input of the multiplier.

In various embodiments, after the interleaver 510 the pair of input signals (comprising an encoded search signal 115 and a TCAM word signal 530 at different polarizations, different positions, different modes, or a combination thereof) are each fed into a multiplier within the multiplier region 520. Each multiplier can comprise an optical element capable of comparing the TCAM word signal 530 against the respective encoded search signal 115, such as (but not limited to) a multipath interferometer. In various embodiments, each multiplier can be configured to perform homodyne detection (i.e., single-wavelength detection). As a non-limiting example, the first multiplier of the multiplier region 520 is configured to receive the first encoded search signal 115a and the first TCAM word signal 530a. The first multiplier can be configured to use the first TCAM word signal 530a as a reference signal (i.e., as the local oscillator signal used in a traditional homodyne detection method). As discussed above, one photodetector of the balanced photodetector array 509 is optically coupled to a respective output of the multiplier of the multiplier region 520. Each branch of the respective multiplier will include the sum of the encoded search signal 115 and the TCAM word signal 530 or the difference between the encoded search signal 115 and the TCAM word signal 530. If the reference signal matches the sample signal (in this context, the first encoded search signal 115a), a non-zero amount of light will be detected by the balanced photodetector array 509 (as shown in Table 5) indicating a mismatch between search word 103 and the TCAM stored word 525. If, however, the bit position of the signals does not match (e.g., the bit of the encoded search signal 110a is a logic '1' but the bit of the first TCAM stored word signal 530a is a logic '0') the first multiplier can be configured such that the product between the output of each arm of the first multiplier results in zero light being detected by the balanced photodetector array 509, thereby indicating a match between the search word 103 and the TCAM stored word 525. In some embodiments, the first multiplier can be configured to activate an output of the multiplier when an amplitude A is present in the reference signal (in this non-limiting example, the first TCAM word signal 530a).

In various embodiments, the coherent detection search engine 500 can be implemented using optical transmission mediums, such as planar integrated optics. In such embodiments, each encoded search signal 115 and TCAM word signal 530 shown in FIG. 5 can propagate through an optical routing element, including but not limited to a waveguide or an optical fiber. In various embodiments, to avoid crossings between the signals, each pair of optical routing elements (e.g., 115c and 530c) can be implemented on a different layer of an integrated optic chip. In various embodiments, the multiplier region 520 can be disposed in one of the plurality of layers of the integrated optic chip, and the signals from each layer can be coupled into the same layer as the multiplier region 520. In various embodiments the coupling can be implemented through the use of one or more coupling elements, including but not limited to mirrors, gratings, or other coupling components. In various embodiments, the multiplier region 520 can be split across the layers of the integrated optic chip/circuit such that an additional coupling component would not be included. The optical interleaver 510 can comprise a plurality of multipath interferometers within the integrated optic chip/circuit. In some embodiments, rather than being perpendicularly propagated as shown in FIG. 5, the TCAM word signals 530 can propagate parallel to the encoded search signals 115, each signal associated with an input of an associated multipath interferometer. In some embodiments, if the crossing losses are acceptable (i.e., within the requirements for a particular application) one or more of the plurality of layers can be combined into a single layer having crossings between the optical routing elements.

Figure 6:
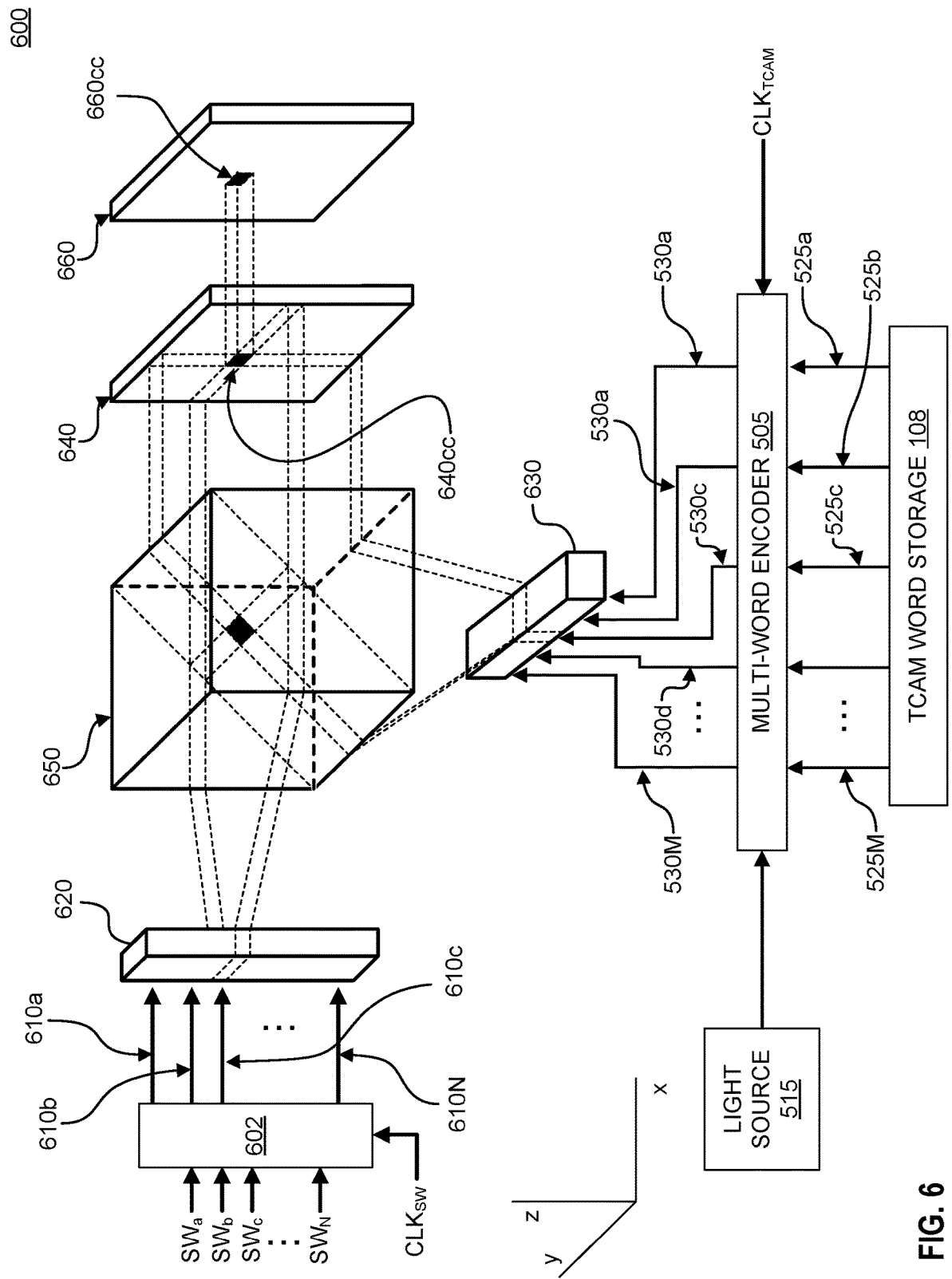
FIG. 6 illustrates an example spatially multiplexed optical search engine in accordance with embodiments of the technology disclosed herein.

The embodiments discussed with respect to FIGS. 1-5 have been with reference to encoding a single search word 103 using the TDM encoding scheme embodied in Tables 1-5. Using the TDM encoding scheme, the optical search engines 100-400 and the coherent detection search engine 500 reduce the number of optical elements required to implement the optical TCAM, thereby increasing the energy efficiency of the TCAM device. In some embodiments, one or more other types of multiplexing can be utilized in combination with the TDM encoding scheme to enable multiple search words to be compared against a plurality of TCAM stored words in parallel. As a non-limiting example, spatial multiplexing using free-space optics or integrated optic chips/circuits can be used to enable multiple search words to be compared against the plurality of TCAM stored words at the same time. FIG. 6 illustrates an example spatially multiplexed optical search engine 600 in accordance with embodiments of the technology disclosed herein. The example spatially multiplexed optical search engine 600 is provided for illustrative purposes only and should not be interpreted as limiting the scope of the technology disclosed herein to only the depicted embodiment. Where references are common between figures it should be interpreted that the discussion as to those references are applicable unless expressly stated otherwise. The spatially multiplexed optical search engine 600 is similar to the coherent detection search engine 500 discussed with respect to FIG. 5, only with multiple search words encoded using a single wavelength.

As shown in FIG. 6, a plurality of search words $SW_a$-$SW_N$ (generally, "the search word SW," collectively, "the search words SW") are received by an input encoder 602, where N is the total number of search words SW received by the input encoder 602. In various embodiments, the plurality of search words $SW_a$-$SW_N$ can be received from a search word source (not shown in FIG. 6) at the same time, while in other embodiments one or more of the plurality of search words $SW_a$-$SW_N$ can be received before another one or more of the plurality of search words $SW_a$-$SW_N$. In various embodiments, the input encoder 602 can be similar to the input encoder 102 discussed with respects to FIGS. 1-5, but input encoder 602 is configured to generate an encoded search signal 610a-610N (generally, "the encoded search signal 610," collectively, "the encoded search signals 610") for each of the received search words $SW_a$-$SW_N$. In various embodiments, all of the encoded search signals 610 can have the same wavelength, with each encoded search signal 610 having a different search word SW encoded thereon. The encoding performed by the input encoder 602 can be the same as the TDM encoding scheme discussed above with respect to FIGS. 1-5. The plurality of TCAM word signals 530 can be generated in a similar manner as discussed with respect to FIG. 5. Specifically, M TCAM word signals 530 can be generated, wherein M is the total number of TCAM stored words that are to be compared against the plurality of search words SW.

A first and a second imaging optics array 620, 630, respectively, can be configured to fan out each encoded search signal 610 and each TCAM word signal 530. In various embodiments, the first imagine optics array 620 and the second imaging optics array 630 can comprise an array of cylindrical lenses configured to fan out the optical signals such that the width of each optical signal (e.g., each encoded search word 610) is wide enough to intersect with all of the perpendicular optical signals (e.g., all of the TCAM word signals 530). In various embodiments, the first and/or second imaging optics array 620, 630 can be implemented as one or more optical imaging elements, including but not limited to lenses, apertures, filters, polarization rotators, mirrors, beam-splitters, pinholes, among others. As a non-limiting example, consider the output of the input encoder 602 comprises a N×1 vector and the output of the multi-word encoder 505 is a M×1 vector. As can be seen in FIG. 6, the first imaging optics array 620 can be configured to fan out the encoded search signal 610c to a length of a free-space optical interleaver 650 along the y-axis and the second imaging optics array 630 can be configured to fan out each TCAM word signal 530c to a length of the free-space optical interleaver 650 along the x-axis. As illustrated, the free-space optical interleaver 650 is represented by a cube having a diagonal face disposed within. In various embodiments, the free-space optical interleaver 650 can be implemented as a lens disposed along the diagonal of the depicted cube, while in other embodiments the free-space optical interleaver 650 can be implemented as a first prism and a second prism that are coupled together along the diagonal to form a transition point. The diagonal (whether a lens, a transition point between two prisms, or another type of optical interleaver) of the free-space optical interleaver 650 is equivalent to the interleaver 510 discussed with respect to FIG. 5, with the diagonal configured to allow the fanned-out encoded search signals 610 to pass straight along the x-axis and to reflect 90 the fanned-out TCAM word signals 530 such that the TCAM word signals 530 change direction from propagating along the z-axis to propagating in along the x-axis in the same direction as the encoded search signals 610. In various embodiments, the imaging optics arrays 620, 630 can comprise include at least one optical imaging element configured to output a fanned-out signal to a respect lane or channel. The number of lanes can be equivalent to the number of encoded search words 115 or the number of TCAM word signals 530 (i.e., N lanes for the encoded search words 115 and M lanes for the TCAM word signals 530). In other embodiments, a plurality of lanes can be optically coupled to a respective optical imaging element within the imaging optics arrays 620, 630.

Accordingly, each encoded search signal 610 is configured to be associated and routed in parallel with each of the TCAM word signals 530. The fanned-out signals essentially represent a matrix-matrix multiplication, with each matrix being N×M in size. In various embodiments, the pairs of input signals can be optically coupled to respective one of a plurality of multipliers within the multiplier region 640. Each of the plurality of multipliers in the multiplier region 640 can be similar to the multipliers in the multiplier region 520 discussed with respect to FIG. 5 in various embodiments. As shown in FIG. 6, the multiplier region 640 can comprise a N×M grid of multipliers optically coupled to the output of the free-space optical interleaver 650. For ease of reference, each multiplier within the multiplier region 640 can be written as multiplier 640ij, where i identifies the encoded search signal 610 and j identifies TCAM word signal 530. As a non-limiting example, the black box on the diagonal in the free-space optical interleaver 650 indicates the junction where the third encoded search signal 610c and the third TCAM word signal 530c intersect within the free-space optical interleaver 650. The depicted example is not to scale and should not be interpreted as such. The multiplier 640cc can perform a comparison similar to that discussed with respect to FIG. 5. The output of the multiplier 640cc can be optically coupled to a respective photodetector 660cc of a photodetector array 660. The photodetector array 660 can be comprise a N×M grid of photodetectors similar to the photodetectors 109 discussed with respect to FIGS. 1-5, with each column in the photodetector array 660 being associated with a respective TCAM stored word 525 and each row in the photodetector array 660 being associated with a respective search word SW.

Figure 7:
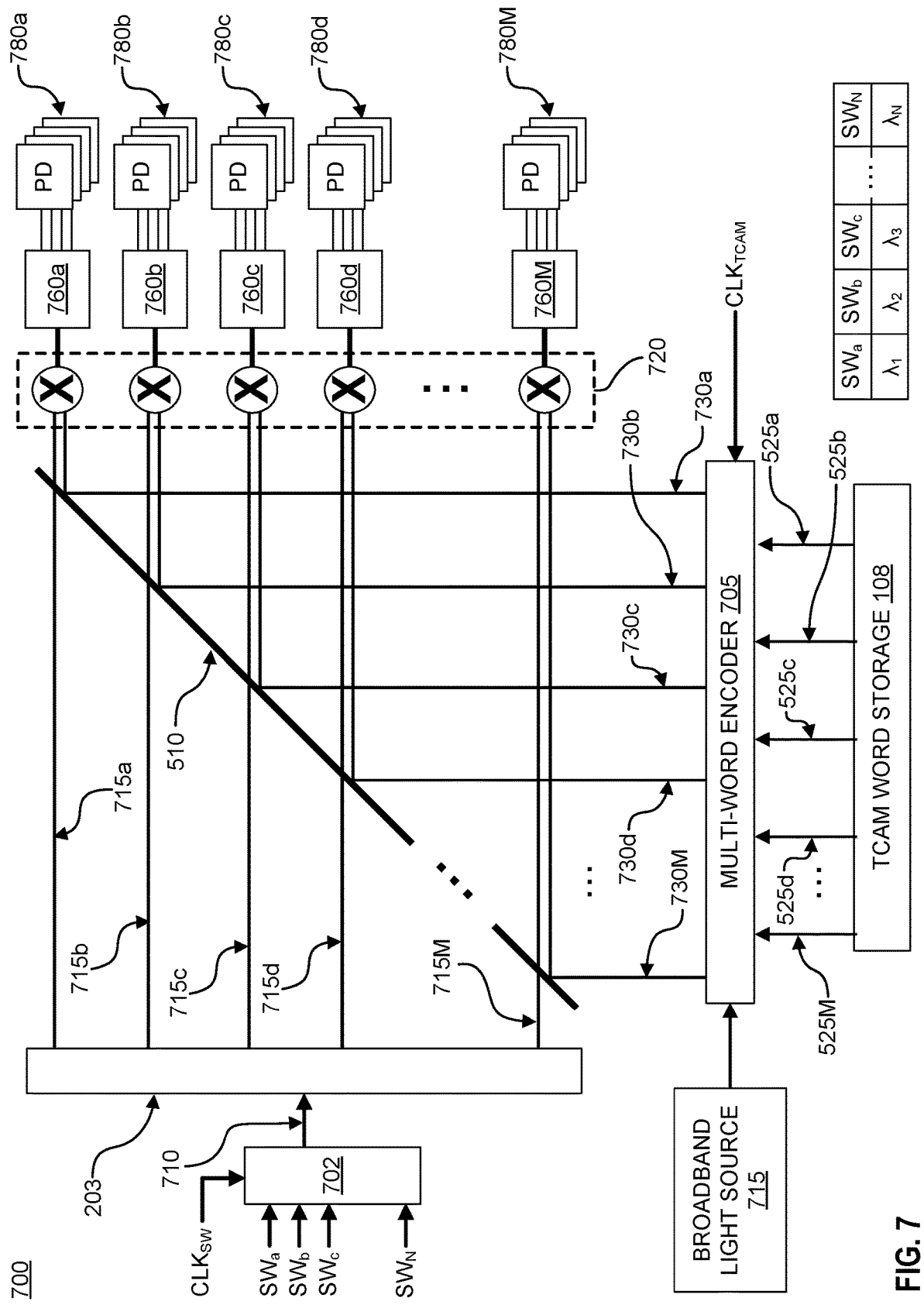
FIG. 7 illustrates an example broadband coherent detection search engine in accordance with embodiments of the technology disclosed herein.

In other embodiments, the TDM encoding scheme can be combined with multiplexing based on wavelength (i.e., WDM) in order to enable a plurality of search words SW to be compared in parallel with a plurality of TCAM stored words. FIG. 7 illustrates an example broadband coherent detection search engine 700 in accordance with embodiments of the technology disclosed herein. The example broadband coherent detection search engine 700 is provided for illustrative purposes only and should not be interpreted as limiting the scope of the technology to only the depicted embodiment. Where references are common between figures it should be interpreted that the discussion as to those references are applicable unless expressly stated otherwise. As shown in FIG. 7, a plurality of search words $SW_a$-$SW_N$ (generally, "the search word SW," collectively, "the search words SW") can be received by an input encoder 702. The input encoder 702 can be configured to encode each of the search words SW onto an assigned wavelength of a plurality of wavelengths $\lambda_1$-$\lambda_N$ (generally, "the assigned wavelength λ," collectively, "the assigned wavelengths λ"). In various embodiments, the input encoder 702 can be similar to the input encoder 102 discussed with respect to FIGS. 1-5, but includes circuitry configured to enable each search word SW to be encoded onto a different assigned wavelength λ. In various embodiments, a broadband light source (not shown in FIG. 7) can be connected to the input encoder 702. The input encoder 702 can output a multi-wavelength encoded search signal 710 comprising each of the assigned wavelengths λ.

The multi-wavelength encoded search signal 710 can be optically coupled to a 1×M splitter 203, similar to the 1×M splitter 203 discussed with respect to FIG. 2. The 1×M splitter 203 can generate M copies of the multi-wavelength encoded search signal 715a-715M, where M is the total number of TCAM stored words 525 against which the search words SW are to be compared. The multi-wavelength encoded search signals 715 can propagate in the same manner as the encoded search signals 115 discussed with respect to FIG. 5.

In various embodiments, a multi-word encoder 705 can be configured to create a plurality of multi-wavelength TCAM word signals 730a-730M (generally, "the multi-wavelength TCAM word signal 730," collectively, "the multi-wavelength TCAM word signals 730"). Each multi-wavelength TCAM word signal 730 can comprise a respective TCAM stored word 525 encoded onto each of the associated wavelengths λ. A broadband light source 715 can be connected to and used by the multi-word encoder 705 to encode each TCAM stored word 525 on all of the associated wavelengths λ. In various embodiments, the broadband light source 715 can be the same broadband light source connected to the input encoder 702, and in some embodiments the broadband light source 715 can be a dedicated light source. The interleaver 510 can be configured to route each multi-wavelength encoded search signal 715 with a respective one of the multi-wavelength TCAM word signals 730, in a similar manner as discussed with respect to FIG. 5. In this way, an optical signal is generated that includes all of the search words SW (on a respective associated wavelength λ) and a respective TCAM search word 525 (encoded on all of the associated wavelengths λ).

The parallel-routed optical signals can be optically coupled to a respective multiplier within the multiplier region 720. The each multiplier within the multiplier region 720 can be similar to the multipliers in the multiplier region 520 discussed with respect to FIG. 5, except that each multiplier in the multiplier region 720 comprises a multi-wavelength multiplier. In some embodiments, each multiplier within the multiplier region 720 can comprise one or more optical elements configured to operate on each of the associated wavelengths λ.

To account for the plurality of associated wavelengths λ, each multiplier within the multiplier region 720 can be optically coupled to a respective demultiplexer 760a-760M (generally, "the demultiplexer 760," collectively, "the demultiplexer 760"). Each of the demultiplexers 760 can be configured to separate light of the respective associated wavelengths λ in a manner similar to the demultiplexer 301 discussed with respect to FIG. 3. Each demultiplexer 760 can comprise a plurality of outputs optically coupled to a photodetector array 780a-780M (generally, "the photodetector array 780," collectively, "the photodetector arrays 780"). Each photodetector within a photodetector array 780 can be associated with a respective TCAM stored word. In various embodiments, each photodetector array 780 can comprise a balanced photodetector array (similar to the balanced photodetector arrays 509 discussed with respect to FIG. 5) per wavelength output from the demultiplexers 760.

In various embodiments, the TDM encoding scheme can be combined with both the spatial multiplexing and WDM approaches in accordance with the example embodiments of FIGS. 6 and 7. In this way, the energy efficiency benefits of all of the approaches can be obtained. As a non-limiting example, longer words, a greater number of words, or a combination thereof can be searched in a more energy efficient manner, increasing the overall throughput and efficiency of the TCAM.

Figure 8:
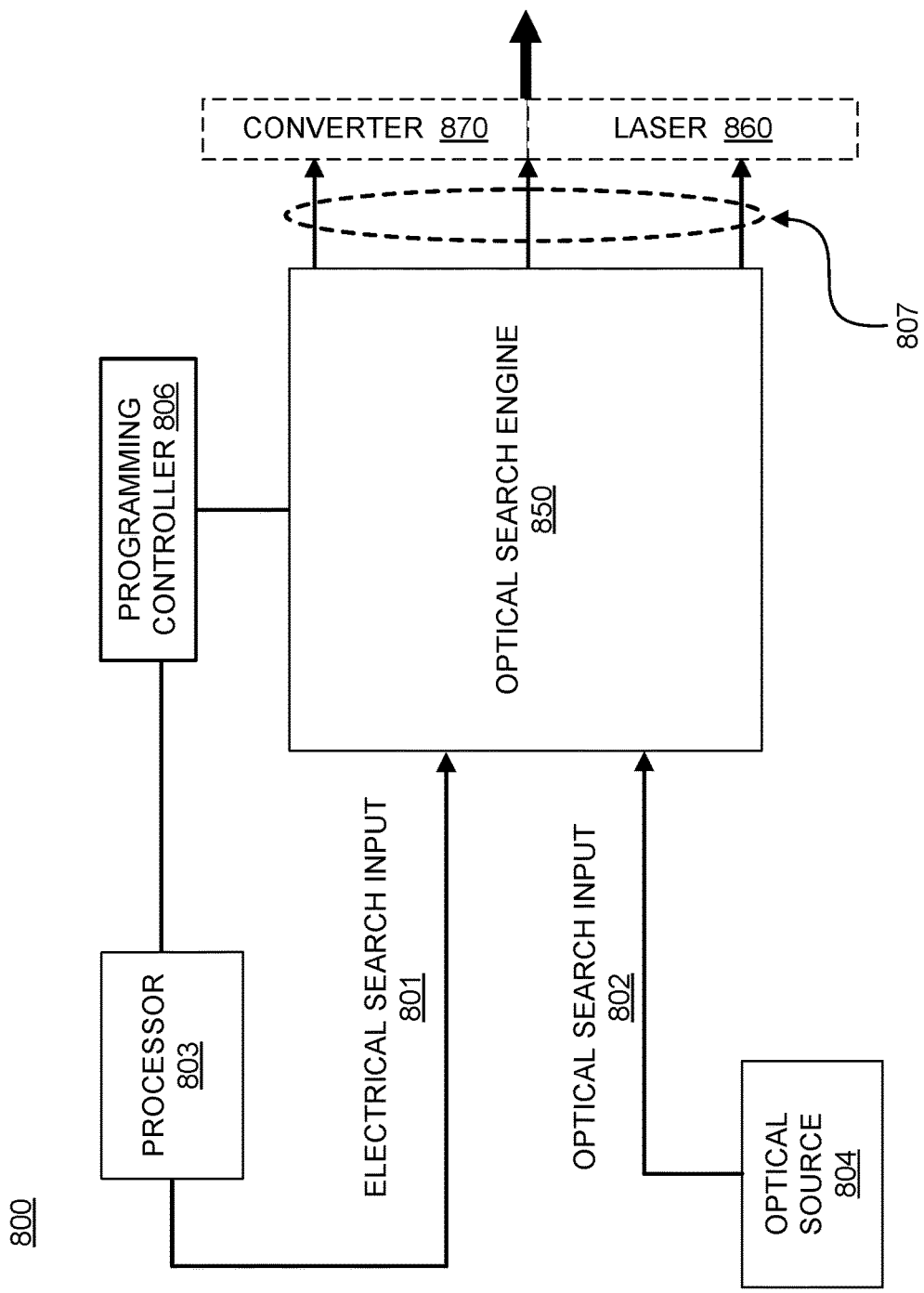
FIG. 8 illustrates an example computing device in accordance with embodiments of the technology disclosed herein.

The optical search engines discussed with respect to FIGS. 1-7 can be implemented within a TCAM component of a device, increasing the speed and efficiency of the search compared to traditional TCAMs. FIG. 8 illustrates an example computing device 800 in accordance with embodiments of the technology disclosed herein. The example computing device 800 is provided for illustrative purpose and should not be interpreted as limiting the scope of the technology only to the depicted embodiment. The example computing device 800 may include more or fewer components in various embodiments. When common references are used between figures, it should be interpreted that all descriptions associated with such reference is applicable to all instances of the reference unless otherwise stated.

As shown in FIG. 8, the computing device 800 can comprise a processor 803. In various embodiments, the processor 803 can be one or more of a general purpose processor (GPU), an application specific integrated circuit (ASIC), a field programmable gate array (FPGA), or other computer processor device known in the art. In various embodiments, the processor 803 can comprise a co-processor configured to control operation of the TCAM search functionality of the computing device 800. In some embodiments, the processor 803 can be configured to send an electrical search word to and optical search engine 850. In various embodiments, the optical search engine 850 can be configured to implement the embodiments discussed above with respect to FIGS. 1-7. One or more applications executed by the processor 803 may request access to a portion of memory within the same network as the computing device 800 by submitting a search word electronically of the electrical search input line 801. The optical search engine 850 can encode the search word on the optical search signals, as discussed with respect to FIGS. 1-7. In various embodiments, the search word may be submitted to the optical search engine 850 optically over the optical search input line 802 from an optical source 804.

In various embodiments, the optical source 804 may comprise an output from an optical transceiver (not shown in FIG. 8) of the computing device 800. The optical transceiver may be configured to receive an optical signal encoded with the search word from one or more other devices connected to the computing device 800. In some embodiments, the optical source 804 can comprise an optical fiber or other optical transmission medium within the computing device 800 and connected to one or more other components within the computing device and/or to the interior output of a faceplate connector. The optically-received search word over the optical search input 802 can be multiplexed into the plurality of optical search signals like that discussed with respect to FIGS. 1-7.

In various embodiments, the processor 803 can be communicatively coupled to the programming controller 806. As discussed with respect to FIGS. 1-7, the programming controller 806 can be configured to program the plurality of modulators within the optical search engine 800 such that the state of each modulator is driven in accordance with the encoding scheme discussed with respect to Tables 1-5. In various embodiments, the processor 803 may send a word to be stored to the programming controller 806, which can then determine how the electrical drive signal should be encoded. In some embodiments, the processor 803 and the programming controller 806 may be the same component. In some embodiments, the programming controller 806 can be configured to receive instructions for operation of the modulators of the optical search engine 850 for each word.

After performing the search, one or more output signals 807 may be output by the optical search engine 850. In various embodiments, the output signals 807 can comprise one or more memory addresses in a memory component within the network and accessible by the computing device 800, whether directly or indirectly (i.e., through another device within the network), corresponding to one or more stored words represented by the plurality of modulators of the optical search engine 850 that were determined to match the search word. The output signal 807 can be sent to either a converter 870, a laser 860, or a combination of both. If the memory address corresponding to the matched TCAM stored word(s) is to be sent to an electronic component (e.g., a memory controller directly connected to the computing device 800) to gain access to the content at the requested memory address(es), the output signal 807 can be sent to the converter 870, which is configured to convert the output signal into an electrical signal comprising the memory address(es). In various embodiments, the converter 870 may comprise an analog-to-digital converter (ADC). If the output signal 807 is to be sent optically to another entity (e.g., another computing device over an optical interconnect), the output signal 807 can be sent to a laser 860 configured to convert the output into an optical signal to be transmitted to another entity, such as a memory controller or another device.

Figure 9:
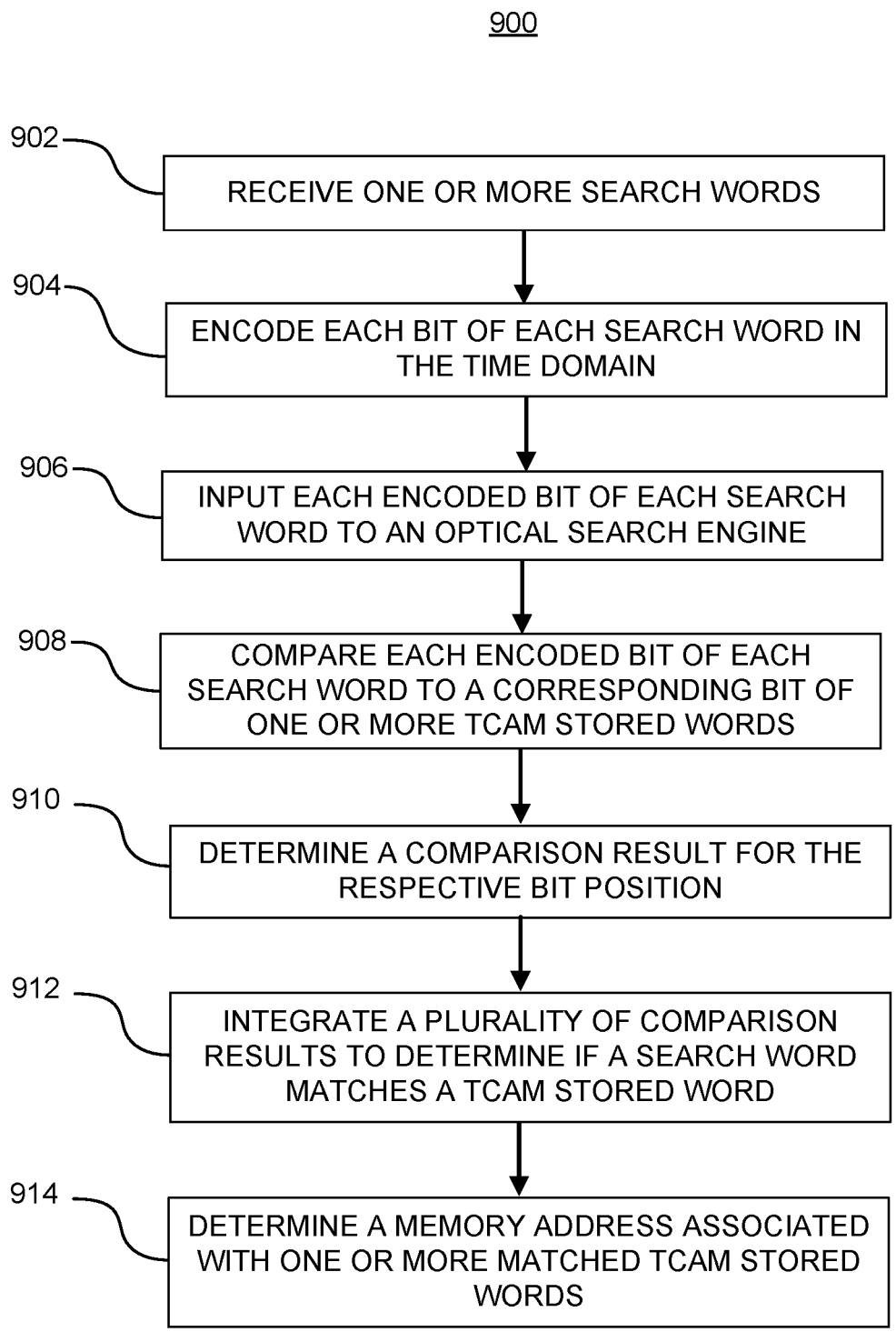
FIG. 9 illustrates an example method in accordance with embodiments of the technology disclosed herein.

FIG. 9 is an example method 900 in accordance with embodiments of the present disclosure. The example method 900 is provided for illustrative purposes only and should not be interpreted as limiting the scope of the technology disclosed herein. The example method 900 can be implemented in optical TCAMs similar to those discussed above with respect to FIGS. 1-8, to perform a ternary search. In various embodiments, the method 900 can comprise one or more non-transitory machine-readable instructions executable by one or more processors of a computing device, and stored on a non-transitory machine-readable storage medium. At operation 902, one or more search words may be received from a search word source. The one or more search words may be received by a search input of an optical search system similar to those discussed with respect to FIGS. 1-8. In various embodiments, the one or more search words may be received as an electronic signal from one or more processors and/or applications that can access the optical search system. In some embodiments, the one or more search words may be received on an encoded optical search signal from an optical source, similar to that discussed above with respect to FIGS. 1-8. In various embodiments, the search word source may comprise a processing circuit, application, optical transceiver, or other source discussed with respect to FIGS. 1-8. In various embodiments, the one or more search words can be received by an input encoder, similar to the input encoders discussed with respect to FIGS. 1-8.

At operation 904, each bit of each of the one or more search words is encoded in the time domain. In various embodiments, encoding each bit can be performed in a similar manner as the TDM encoding scheme discussed with respect to Tables 1-5 above. Each bit of the search word can be associated with two time slots. In various embodiments, the time slots can be determined based on a clock signal from a clock source. As a non-limiting example, during a first clock cycle the input encoder can set the value of the first time slot associated with a bit position, during the second clock cycle the input encoder can set the value of the second time slot associated with the same bit position and the modulator can be set in accordance with first time slot associated with the same bit position for the TCAM stored word, and so on. That is, the input encoder and modulator can operate in parallel In various embodiments, the same clock signal can be used to encode each corresponding bit of one or more TCAM stored words, while in other embodiments separate clock signals can be used to encode the search words and the TCAM stored words. In various embodiments, a delayed clock signal can be used to encode the corresponding bit position of the TCAM stored words.

In some embodiments, operation 904 can optionally include spatially multiplexing each of the one or more search words in a manner similar to that discussed with respect to FIG. 6 above. Spatially multiplexing each of the one or more search words can comprise fanning out the encoded optical signal for each search word in accordance with a free-space optical combiner/splitter. In various embodiments, each of the one or more search words can be encoded on a single wavelength. In some embodiments, operation 904 could optionally include associating a wavelength of a plurality of wavelengths with each search word of the one or more search words so that the respective search word is encoded on light of the associated wavelength. In various embodiments, each of the one or more search words can be multiplexed both spatially and through WDM in addition to encoding the search words in the time domain (i.e., TDM encoding).

The encoded one or more search words can be input into an optical search engine at operation 906. Inputting the one or more encoded search words can comprise outputting an encoded search signal on an input routing element, similar to the input routing element discussed with respect to FIGS. 1-8. In various embodiments, inputting an encoded search signal can include generating one or more copies of the encoded search signal using a splitter, such as the 1×M splitter discussed with respect to FIGS. 1-8. In some embodiments, each of the one or more search words may be input on a separate encoded search signal, while in other embodiments all of the search words can be input on a multi-wavelength encoded search signal. In some embodiments, each search word may be encoded on a plurality of wavelengths, while in other embodiments each search word may be encoded on an associated wavelength.

At operation 908, each encoded bit of each of the search words is compared to a corresponding bit of one or more TCAM stored words. The comparison may be performed in a manner similar to that discussed with respect to FIGS. 1-8. In various embodiments, a modulator of the optical search engine can be driven by a programming controller to encode a TCAM stored word of the plurality of TCAM stored words in the time domain, similar to the encoding of each of the search words. In some embodiments, encoding the TCAM stored words can comprise generating one or more TCAM word signals representing each of the TCAM stored words. At operation 910, the comparison result for a respective bit position is determined. In some embodiments, each bit-based comparison result can be determined within the duration of the word comparison, while in other embodiments each bit-based comparison result can be determined after all of the encoded bits are compared against a plurality of TCAM stored words (e.g., all of the encoded bits of the search word have traversed a plurality of modulators). In some embodiments, a plurality of TCAM stored words can be searched in parallel, each TCAM stored word having a respective input routing element configured to optically couple a copy of the encoded search signal from the input encoder.

At operation 912, a plurality of comparison results can be integrated to determine if a search word matches a TCAM stored word. After all of the associated time slots used to encode a search word traverse the optical search engine, a photodetector can be configured to integrate all the light signals received on one or more optical routing elements and/or free-space optical paths. The integration can be performed in a manner similar to that discussed above with respect to FIGS. 1-8. At operation 914, a memory address associated with one or more matched TCAM stored words can be determined. This determination can be similar to the determination discussed with respect to FIGS. 1-8.

Figure 10:
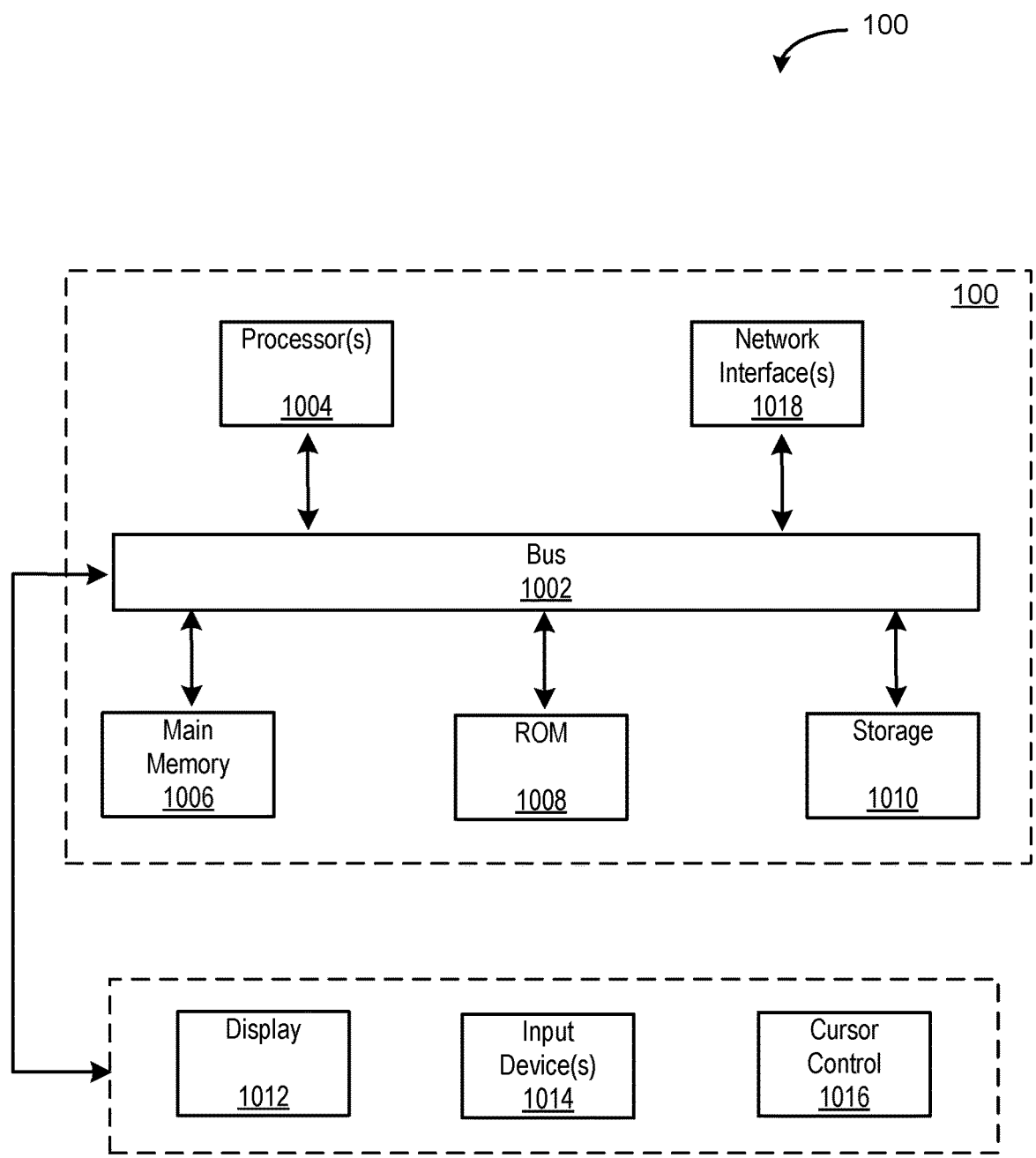
FIG. 10 is an example computing component that may be used to implement various features of embodiments described in the present disclosure.

FIG. 10 depicts a block diagram of an example computer system 1000 in which various of the embodiments described herein may be implemented. The computer system 1000 includes a bus 1002 or other communication mechanism for communicating information, one or more hardware processors 1004 coupled with bus 1002 for processing information. Hardware processor(s) 1004 may be, for example, one or more general purpose microprocessors. The computer system 1000 can be similar to the computing system 800 discussed with respect to FIG. 8 in various embodiments.

The computer system 1000 also includes a main memory 1006, such as a random access memory (RAM), cache and/or other dynamic storage devices, coupled to bus 1002 for storing information and instructions to be executed by processor 1004. Main memory 1006 also may be used for storing temporary variables or other intermediate information during execution of instructions to be executed by processor 1004. Such instructions, when stored in storage media accessible to processor 1004, render computer system 1000 into a special-purpose machine that is customized to perform the operations specified in the instructions.

The computer system 1000 further includes a read only memory (ROM) 1008 or other static storage device coupled to bus 1002 for storing static information and instructions for processor 1004. A storage device 1010, such as a magnetic disk, optical disk, or USB thumb drive (Flash drive), etc., is provided and coupled to bus 1002 for storing information and instructions.

The computer system 1000 may be coupled via bus 1002 to a display 1012, such as a liquid crystal display (LCD) (or touch screen), for displaying information to a computer user. An input device 1014, including alphanumeric and other keys, is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. In some embodiments, the same direction information and command selections as cursor control may be implemented via receiving touches on a touch screen without a cursor.

The computing system 1000 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 1000 may implement the techniques described herein using customized hard-wired logic, one or more ASICs or FPGAs, firmware and/or program logic which in combination with the computer system causes or programs computer system 1000 to be a special-purpose machine. According to one embodiment, the techniques herein are performed by computer system 1000 in response to processor(s) 1004 executing one or more sequences of one or more instructions contained in main memory 1006. Such instructions may be read into main memory 1006 from another storage medium, such as storage device 1010. Execution of the sequences of instructions contained in main memory 1006 causes processor(s) 1004 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 1000. Volatile media includes dynamic memory, such as main memory 1006. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 1002. Transmission media can also take the form of acoustic or light waves, such as those generated during radio-wave and infra-red data communications.

The computer system 1000 also includes a communication interface 1018 coupled to bus 1002. Network interface 1018 provides a two-way data communication coupling to one or more network links that are connected to one or more local networks. For example, communication interface 1018 may be an integrated services digital network (ISDN) card, cable modem, satellite modem, or a modem to provide a data communication connection to a corresponding type of telephone line. As another example, network interface 1018 may be a local area network (LAN) card to provide a data communication connection to a compatible LAN (or WAN component to communicated with a WAN). Wireless links may also be implemented. In any such implementation, network interface 1018 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 1018, which carry the digital data to and from computer system 1000, are example forms of transmission media.

The computer system 1000 can send messages and receive data, including program code, through the network(s), network link and communication interface 1018. In the Internet example, a server might transmit a requested code for an application program through the Internet, the ISP, the local network and the communication interface 1018.

The received code may be executed by processor 1004 as it is received, and/or stored in storage device 1010, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 1000.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A optical ternary content addressable memory (TCAM) comprising:
    an input encoder configured to encode a search word on an optical search signal, wherein each bit position of the search word is represented by at least two time slots of a clock signal;
    a splitter optically coupled to an output of the input encoder configured to generate a plurality of copies of the optical search signal;
    a multi-word encoder configured to generate a plurality of TCAM word signals, each TCAM word signal encoding a TCAM stored word of a plurality of TCAM stored words and wherein each bit position of the TCAM stored word is represented by at least two time slots of the clock signal;
    an optical interleaver configured to route a copy of the optical search signal of the plurality of copies of the optical search signal and a TCAM word signal of the plurality of TCAM word signals to propagate in parallel as a plurality of pairs of inputted signals;

a plurality of multipliers, each multiplier configured to receive a pair of inputted signals of the plurality of pairs of inputted signals and compare the respective copy of the plurality of copies of the optical search signal and the respective TCAM word signal; and a plurality of balanced photodetectors arrays, each balanced photodetector array optically coupled to an output of a respective multiplier of the plurality of multipliers, wherein each balanced photodetector array is configured to detect a mismatch between the respective copy of the plurality of copies of the optical search signal output from a first output of a respective multiplier and the respective TCAM word signal output from a second output of the respective multiplier by detecting light during at least one time slot of the clock signal.

2. The optical TCAM of claim 1, wherein each bit position of the search word is associated with a first time slot and a second time slot of the clock signal, and each bit position of the search word is encoded as either light having an amplitude or no light.

3. The optical TCAM of claim 2, wherein:
a bit position of the encoded search word represents a logic '1' when light having an amplitude is included in the optical search signal during the first time slot associated with the respective bit position and no light is included in the optical search signal during the second time slot associated with the respective bit position;

a bit position of the optical search signal represents a logic '0' when no light is included in the optical search signal in the first time slot associated with the respective bit position and light having an amplitude is included in the optical search signal during the second time slot associated with the respective bit position; and a bit position of the optical search signal represents a wildcard value when no light is included in the optical search signal during the first time slot and the second time slot associated with the respective bit position.

4. The optical TCAM of claim 2, wherein;
a bit position of the TCAM word signal represents a logic '0' when light having an amplitude is included in the TCAM word signal during the first time slot associated with the respective bit position and no light is included in the TCAM word signal during the second time slot associated with the respective bit position;

a bit position of the TCAM word signal represents a logic '1' when no light is included in the TCAM word signal during the first time slot associated with the respective bit position and light having an amplitude is included in the TCAM word signal during the second time slot associated with the respective bit position; and a bit position of the TCAM word signal represents a wildcard value when no light is included in the TCAM word signal during the first time slot and the second time slot associated with the respective bit position.

5. The optical TCAM of claim 1, wherein the input encoder is configured to receive a plurality of search words and to encode each of the plurality of search words onto an optical search signal of a plurality of optical search signals.

6. The optical TCAM of claim 5, further comprising
a first imaging optics array configured to optically fan out each of the plurality of optical search signals; and
a second imaging optics array configured to optically fan out each of the plurality of TCAM word signals.

7. The optical TCAM of claim 1, wherein:
the input encoder is further configured to:
receive a plurality of search words;
encode each of the plurality of search words on a wavelength of a plurality of wavelengths; and
output a plurality of multi-wavelength encoded search signals, each multi-wavelength encoded search signal comprising each of the plurality of search words encoded on a respective wavelength of the plurality of wavelengths; and the multi-word encoder further configured to:
encode each TCAM stored word on each of the plurality of wavelengths; and
output a plurality of multi-wavelength TCAM word signals, each multi-wavelength TCAM word signal comprising the respective TCAM word signal encoded on all of the wavelengths of the plurality of wavelengths.

* * * * *